United States Patent
Wu

(10) Patent No.: US 12,237,772 B2
(45) Date of Patent: Feb. 25, 2025

(54) EFFICIENT BOOTSTRAP SUPPLY GENERATORS FOR MULTI-LEVEL POWER CONVERTERS

(71) Applicant: Murata Manufacturing Co., Ltd., Kyoto (JP)

(72) Inventor: Gary Chunshien Wu, San Diego, CA (US)

(73) Assignee: Murata Manufacturing Co., Ltd., Kyoto (JP)

( * ) Notice: Subject to any disclaimer, the term of this patent is extended or adjusted under 35 U.S.C. 154(b) by 16 days.

(21) Appl. No.: 18/307,631

(22) Filed: Apr. 26, 2023

(65) Prior Publication Data

US 2023/0344352 A1 Oct. 26, 2023

Related U.S. Application Data

(63) Continuation of application No. 17/559,931, filed on Dec. 22, 2021, now Pat. No. 11,646,665.

(Continued)

(51) Int. Cl.
*H02M 3/158* (2006.01)
*H02M 1/00* (2006.01)
(Continued)

(52) U.S. Cl.
CPC ....... *H02M 3/1584* (2013.01); *H02M 1/0045* (2021.05); *H02M 1/08* (2013.01); *H03K 3/037* (2013.01); *H02M 3/07* (2013.01)

(58) Field of Classification Search
None
See application file for complete search history.

(56) References Cited

U.S. PATENT DOCUMENTS

| | | | |
|---|---|---|---|
| 4,257,087 A | 3/1981 | Cuk | |
| 4,654,769 A | 3/1987 | Middlebrook | |

(Continued)

FOREIGN PATENT DOCUMENTS

| | | |
|---|---|---|
| CN | 110545040 | 12/2019 |
| CN | 111697821 | 9/2020 |

(Continued)

OTHER PUBLICATIONS

Novak, Peter Michael, Final Office Action received from the USPTO dated Jan. 22, 2024 for U.S. Appl. No. 17/560,683, 22 pgs.

(Continued)

*Primary Examiner* — Jeffrey S Zweizig
(74) *Attorney, Agent, or Firm* — Haynes and Boone, LLP

(57) ABSTRACT

Circuits and methods for providing a "bootstrap" power supply for level-shifter/driver (LS/D) circuits in a FET-based power converter. In a first embodiment, linear regulators and a bootstrap capacitor provide a bootstrap power supply for level-shifter/driver circuits in each tier of a multi-level FET-based power converter. In a second embodiment, floating charge circuits and bootstrap capacitors provide an improved bootstrap power supply for level-shifter and driver circuits in each tier of a multi-level FET-based power converter. More particularly, a floating charge circuit configured to be coupled to an associated bootstrap capacitor includes a first sub-circuit configured to pre-charge the associated bootstrap capacitor when coupled and a second sub-circuit configured to transfer charge between the bootstrap capacitor and a bootstrap capacitor coupled to an adjacent floating charge circuit.

20 Claims, 17 Drawing Sheets

Related U.S. Application Data

(60) Provisional application No. 63/214,450, filed on Jun. 24, 2021.

(51) Int. Cl.
   H02M 1/08 (2006.01)
   H03K 3/037 (2006.01)
   H02M 3/07 (2006.01)

(56) References Cited

U.S. PATENT DOCUMENTS

| | | |
|---|---|---|
| 4,720,668 A | 1/1988 | Lee |
| 5,969,484 A | 10/1999 | Santi |
| 6,294,900 B1 | 9/2001 | Greenwood |
| 6,304,460 B1 | 10/2001 | Cuk |
| 8,159,200 B2 | 4/2012 | Lesso |
| 9,160,232 B2 | 10/2015 | Thomas et al. |
| 9,337,732 B2 | 5/2016 | Kondou |
| 9,571,006 B2 | 2/2017 | Stahl et al. |
| 9,641,071 B2 | 5/2017 | Logiudice |
| 9,748,841 B2 | 8/2017 | Granato |
| 9,899,918 B2 | 2/2018 | Lee |
| 10,090,763 B1 | 10/2018 | Mercer |
| 10,547,241 B1 | 1/2020 | Li |
| 10,686,367 B1 | 6/2020 | Low |
| 10,720,842 B1 | 7/2020 | Wu et al. |
| 10,720,843 B1 | 7/2020 | Wu |
| 10,770,974 B2 | 9/2020 | Wu et al. |
| 10,992,226 B1 | 4/2021 | Aboueldahab et al. |
| 11,646,665 B2 | 5/2023 | Wu |
| 2006/0087295 A1 | 4/2006 | Jang |
| 2009/0001955 A1 | 1/2009 | Yoshida |
| 2009/0059630 A1 | 3/2009 | Williams |
| 2009/0189393 A1 | 7/2009 | Tyagi |
| 2010/0052050 A1 | 3/2010 | Lofti et al. |
| 2010/0259240 A1 | 10/2010 | Cuk |
| 2011/0057640 A1 | 3/2011 | Cuk |
| 2012/0194164 A1 | 8/2012 | Ligiudice |
| 2012/0262967 A1 | 10/2012 | Cuk |
| 2012/0268969 A1 | 10/2012 | Cuk |
| 2013/0088211 A1 | 4/2013 | Radtke |
| 2014/0232364 A1 | 8/2014 | Thomas |
| 2015/0003127 A1 | 1/2015 | Takizawa |
| 2015/0230302 A1 | 8/2015 | Ito |
| 2016/0118817 A1 | 4/2016 | Uno |
| 2016/0197552 A1 | 7/2016 | Giuliano |
| 2018/0026518 A1 | 1/2018 | Liu |
| 2018/0062507 A1 | 3/2018 | Giuliano |
| 2018/0123341 A1 | 5/2018 | Lehn |
| 2018/0131281 A1 | 5/2018 | Inoue |
| 2018/0166994 A1 | 6/2018 | Dorn |
| 2019/0109530 A1 | 4/2019 | Perreault |
| 2019/0115830 A1 | 4/2019 | Giuliano |
| 2019/0199221 A1 | 6/2019 | Zhao |
| 2019/0319526 A1 | 10/2019 | Yang |
| 2020/0228016 A1 | 7/2020 | Wu |
| 2020/0243744 A1 | 7/2020 | Chaput |
| 2021/0367430 A1 | 11/2021 | Da Silva |
| 2022/0190712 A1 | 6/2022 | Chen |
| 2022/0190738 A1 | 6/2022 | Chen |
| 2022/0224231 A1 | 7/2022 | Rizzolatti |
| 2022/0321010 A1 | 10/2022 | Bieber |
| 2022/0416653 A1 | 12/2022 | Giuliano et al. |
| 2022/0416664 A1 | 12/2022 | Wu |
| 2023/0136027 A1 | 5/2023 | Szczeszynski |
| 2023/0142335 A1 | 5/2023 | Szczeszynski |
| 2023/0148059 A1 | 5/2023 | Szczeszynski |
| 2023/0344352 A1 | 10/2023 | Wu |
| 2023/0387796 A1 | 11/2023 | Wu |

FOREIGN PATENT DOCUMENTS

| | | |
|---|---|---|
| WO | 2023081610 | 5/2023 |
| WO | 2023229900 | 11/2023 |

OTHER PUBLICATIONS

Szczeszynski, Gregory, "Controlling Charge-Balance and Transients in a Multi-Level Power Converter", provisional application filed Nov. 8, 2021, U.S. Appl. No. 63/276,923, 104 pgs.

Giuliano, David, "Multi-Level Structures and Methods for Switched-Mode Power Supplies", patent application filed Dec. 22, 2021, U.S. Appl. No. 17/559,945, 74 pgs.

Szczeszynski, Gregory, "Controlling Charge-Balance and Transients in a Multi-Level Power Converter", patent application filed Dec. 23, 2021, U.S. Appl. No. 17/560,767, 78 pgs.

Szczeszynski, Gregory, "Protecting Multi-Level Power Converters", patent application filed Dec. 23, 2021, U.S. Appl. No. 17/560,700, 50 pgs.

Szczeszynski, Gregory, "Improving Light-Load Recovery in a Multi-Level Converter", patent application filed Dec. 23, 2021, U.S. Appl. No. 17/560,683, 52 pgs.

Kellner, Alexandria, International Search Report and Written Opinion received from the EPO dated Feb. 2, 2023 for appln. No. PCT/US2022-078717, 12 pgs.

Da Rocha, et al., "Level Shifters and DCVSL for a Low-Voltage CMOS 4.2-V Buck Converter", IEEE Transactions on Industrial Electronics, vol. 55, No. 9, Sep. 2008, pp. 3315-3323.

Kruip, Stephan, International Search Report and Written Opinion received from the EPO dated Feb. 27, 23 for appln. No. PCT/US2022/078918, 9 pgs.

Sepahvand, et al., "Start-Up Procedure and Switching Loss Reduction for a Single-Phase Flying Capacitor Active Rectifier", IEEE Transactions on Industrial Electronics, vol. 60, No. 9, Sep. 2013, pp. 3699-3710.

Kruip, Stephan, International Search Report and Written Opinion received from the EPO dated Feb. 28, 2023 for appln. No. PCT/US2022/078920, 10 pgs.

Yuan, et al., "Self-Balancing of the Clamping-Capacitor-Voltages in the Multilevel Capacitor-Clamping-Inverter under Sub-Harmonic PWM Modulation", IEEE Transactions on Power Electronics, vol. 16, No. 2, Mar. 2001, pp. 256-263.

Jia, et al., "Active Power Decoupling for a Modified Modular Multilevel Converter to Decrease Submodule Capacitor Voltage Ripples and Power Losses", IEEE Transactions on Power Electronics, vol. 36, No. 3, Mar. 2021, pp. 2835-2851.

Ahmed, Yusef A., Office Action received from the USPTO dated Feb. 1, 2023 for U.S. Appl. No. 17/559,945, 19 pgs.

Zweizig, Jeffery Shawn, Office Action received from the USPTO dated Oct. 14, 2022 for U.S. Appl. No. 17/559,931, 11 pgs.

Zweizig, Jeffery Shawn, Notice of Allowance received from the USPTO dated Dec. 28, 2022 for U.S. Appl. No. 17/559,931, 7 pgs.

Tiku, Sisay G., Office Action received from the USPTO dated Jul. 7, 2023 for U.S. Appl. No. 17/560,700, 17 pgs.

Novak, Peter Michael, Office Action received from the USPTO dated Aug. 4, 2023 for U.S. Appl. No. 17/560,683, 18 pgs.

Nelson, Carl, Analog Circuit Design Stub from Chapter 5—LT1070 design manual, Editors: Bob Dobkin, Jim Williams, ISBN 9780123851857 (Year: 2011).

Novak, Peter Michael, Notice of Allowance received from the USPTO dated Jul. 17, 2024 for U.S. Appl. No. 17/560,683, 11 pgs.

Tiku. Sosay G., Notice of Allowance and Examiner-Initiated Interview Summary received from the USPTO dated Sep. 23, 2024 for U.S. Appl. No. 18/581,617, 34 pgs.

EFFICIENT BOOTSTRAP SUPPLY GENERATORS FOR MULTI-LEVEL POWER CONVERTERS

CROSS-REFERENCE TO RELATED APPLICATIONS—CLAIM OF PRIORITY

This application is a continuation of commonly owned and co-pending U.S. application Ser. No. 17/559,931, filed Dec. 22, 2021, entitled "Efficient Bootstrap Supply Generators for Multi-Level Power Converters", to issue on May 9, 2023 as U.S. Pat. No. 11,646,665, the disclosure of which is incorporated herein by reference in its entirety. Application Ser. No. 17/559,931 claims priority to U.S. provisional Patent Application No. 63/214,450, filed on Jun. 24, 2021, for a "Efficient Bootstrap Supply Generators for Multi-Level Power Converters", which is herein incorporated by reference in its entirety.

BACKGROUND

(1) Technical Field

This invention relates to electronic circuits, and more particularly to power converter circuits, including DC-DC power converter circuits.

(2) Background

Many electronic products, particularly mobile computing and/or communication products and components (e.g., cell phones, notebook computers, ultra-book computers, tablet devices, LCD and LED displays) require multiple voltage levels. For example, radio frequency (RF) transmitter power amplifiers may require relatively high voltages (e.g., 12V or more), whereas logic circuitry may require a low voltage level (e.g., 1-2V). Still other circuitry may require an intermediate voltage level (e.g., 5-10V).

Power converters are often used to generate a lower or higher voltage from a common power source, such as a battery. Power converters include DC-DC or AC-DC converters. One type of power converter comprises a converter circuit, control circuitry, and auxiliary circuitry such as bias voltage generator(s), a clock generator, a voltage regulator, a voltage control circuit, etc. Power converters which generate a lower output voltage level from a higher input voltage power source are commonly known as buck converters, so-called because $V_{OUT}$ is less than $V_{IN}$, and hence the converter is "bucking" the input voltage. Power converters which generate a higher output voltage level from a lower input voltage power source are commonly known as boost converters, because $V_{OUT}$ is greater than $V_{IN}$. Some power converters may be either a buck converter or a boost converter depending on which terminals are used for input and output. Some power converters may provide an inverted output.

FIG. 1 is a block diagram of a prior art power converter 100. A converter circuit 102 having input terminals T1/T1' and output terminals T2/T2' is configured such that input terminals T1/T1' are coupled to a voltage source 104 (e.g., a battery) and output terminals T2/T2' are coupled to an output capacitor $C_{OUT}$ and a load 106 (which also may be represented as an equivalent resistance R). The converter circuit 102 may be, for example, a switched-capacitor network such as a charge pump, or an inductor-based regulator. Examples of charge pumps include cascade multiplier, Dickson, Ladder, Series-Parallel, Fibonacci, and Doubler switched-capacitor networks, all of which may be configured as a multi-phase or a single-phase switched-capacitor network. A power converter 100 based on a charge pump-type converter circuit 102 uses capacitors as the primary energy storage elements to transfer charge from the input to the output of the power converter 100. These charge transfer capacitors are commonly known as "fly capacitors" or "pump capacitors" and may be external components coupled to an integrated circuit embodiment of the power converter 100. In contrast, a power converter 100 using an inductor-based regulator for the converter circuit 102 uses an inductor or transformer as the primary energy storage element instead of capacitors. Examples of inductor-based regulators include well-known buck, boost, buck-boost, resonant, multi-level, Cuk, SEPIC, Forward, and Full-Bridge configurations.

In the illustrated example, the voltage applied across input terminals T1/T1' is $V_{IN}$, and the converted voltage provided across output terminals T2/T2' is $V_{OUT}$. A controller 108 outputs a set of control-signals 112 that control the internal components of the converter circuit 102 (e.g., internal switches, such as low voltage FETs, especially MOSFETs) to cause the converter circuit 102 to either boost or buck $V_{IN}$ to $V_{OUT}$. The controller 108 may also receive a separate set of control signals 112 indicative of the converter circuit 102 operation. An auxiliary circuit 110 may provide various voltages and/or signals to the controller 108 (and optionally directly to the converter circuit 102), such as a voltage $V_{DD}$, a clock signal CLK, a circuit bias voltage $V_{BIAS}$, and one or more control signals CTRL. Power to the illustrated auxiliary circuit 110 is supplied at $V_{INPUT}$, and may come from the illustrated voltage source 104 or from another source.

FIG. 2 is a schematic diagram of one type of prior art inductor-based multi-level buck converter circuit 200 that may be used as the converter circuit of FIG. 1. In the illustrated example, which is a 5-level buck converter, an inductor-based multi-level DC-to-DC converter switches between at least three states, each of which defines one of at least three different voltages presented to an inductor L coupled to an output capacitor $C_{OUT}$ and a load resistance R. During normal operation for a particular input voltage and output voltage, a multi-level converter circuit switches back and forth between two states (e.g., between 0 V and $V_{IN}/2$). However, as the input voltage and/or output voltage changes, it may be necessary to change to a different pair of states (e.g., $V_{IN}/2$ and $V_{IN}$). An inductor-based multi-level DC-to-DC converter may be configured as a buck only converter, as a boost only converter, or as a buck-boost converter, and may be inverting or non-inverting.

In greater detail, the multi-level converter 200 converts an input voltage $V_{IN}$ to an output voltage $V_{OUT}$ by actively switching two or more series-connected power switches (generally MOSFETs). The state transition patterns of the power switches determine operational zones and corresponding $V_{OUT}$ ranges. In the example of FIG. 2, the multi-level converter circuit 200 includes a shunt inductor L bracketed by two sets of series-connected power switches, Sw1-Sw4 and Sw5-Sw8. Each pair of power switches in the first and second sets of series-coupled power switches is separated by a respective node. The node between each pair of power switches in one set is coupled by a fly capacitor $C_{FX}$ to the corresponding node between each pair of power switches in the other set. For example, in FIG. 2, node A between power switches Sw3 and Sw4 is coupled by fly capacitor $C_{F1}$ to node B between power switches Sw5 and Sw6. Controlling clock signals for each set of power switches are complementary and are provided by a control circuit (e.g., the controller 108 of FIG. 1).

In general, in power converters, particularly multi-level power converters, the power switches (such as power switches Sw1-Sw8 in FIG. 2) are implemented with FETs, especially MOSFETs. For each power FET, a level shifter and a driver circuit is generally required to translate ground-referenced low-voltage logic ON/OFF signals from an analog or digital controller into a signal with the same voltage swing but referenced to the source voltage of the power FET that the signal is driving in order to charge or discharge the gate of the power FET and thereby control the conducting or blocking state of the power FET. In some applications, the functions of a level shifter and a driver circuit may be incorporated into one circuit.

A challenge in designing power converters that utilize level-shifter/driver (LS/D) circuits to control power FETs is supplying adequate power to the LS/D circuits themselves, particularly at startup of such power converters. The present invention addresses that challenge.

SUMMARY

The present invention encompasses circuits and methods for providing a "bootstrap" power supply for level-shifter/driver (LS/D) circuits in a FET-based power converter.

In a first embodiment, linear regulators and a bootstrap capacitor provide a bootstrap power supply for level-shifter/driver circuits in each tier of a multi-level FET-based power converter.

In a second embodiment, floating charge circuits and bootstrap capacitors provide an improved bootstrap power supply for level-shifter and driver circuits in each tier of a multi-level FET-based power converter. More particularly, a floating charge circuit configured to be coupled to an associated bootstrap capacitor includes a first sub-circuit configured to pre-charge the associated bootstrap capacitor when coupled and a second sub-circuit configured to transfer charge between the bootstrap capacitor and a bootstrap capacitor coupled to an adjacent floating charge circuit.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements unless stated otherwise.

DETAILED DESCRIPTION

The present invention encompasses circuits and methods for providing a "bootstrap" power supply for level-shifter/driver (LS/D) circuits in a FET-based power converter.

Linear Regulator Embodiment

Figure 3A:
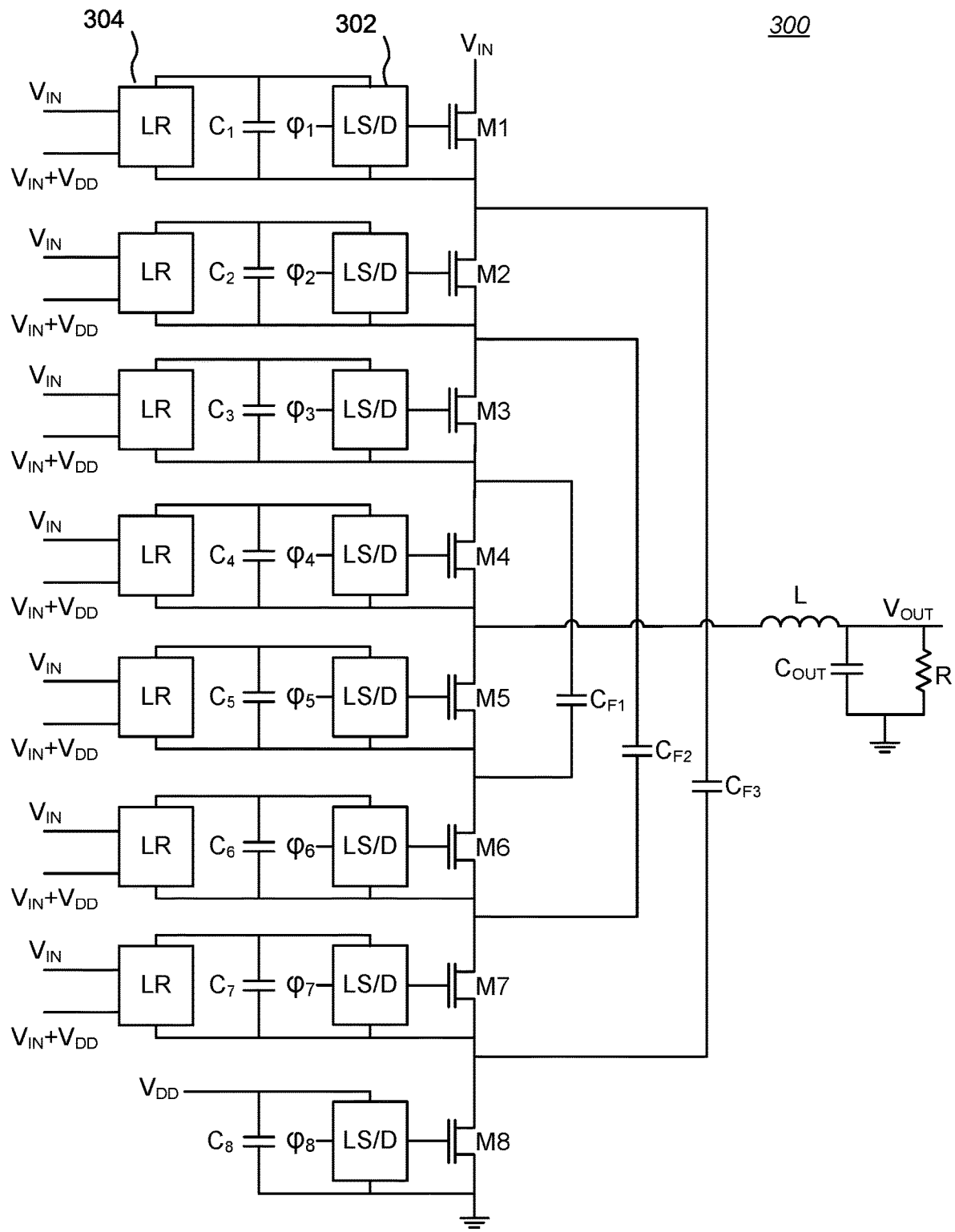
FIG. 3A is a block diagram of one embodiment of a FET-based buck power converter utilizing linear regulators and bootstrap capacitors provide a bootstrap power supply for level-shifter/driver circuits.

FIG. 3A is a block diagram of one embodiment of a FET-based buck power converter 300 utilizing linear regulators and bootstrap capacitors provide a bootstrap power supply for level-shifter/driver circuits (note that reference numbers have not been applied to all similar components of the power converter 300 to avoid clutter). The buck power converter 300 is a 5-level converter that steps a higher positive input voltage down to a lower voltage and is particularly efficient as compared to a standard 2-level topology when the voltage step-down ratio is large and there is an inductor size constraint such that the inductor has the dominant power loss. In addition, the power FETs are not required to be rated for at least $V_{IN}$, but instead can be rated for $V_{IN}/4$.

Figure 1:
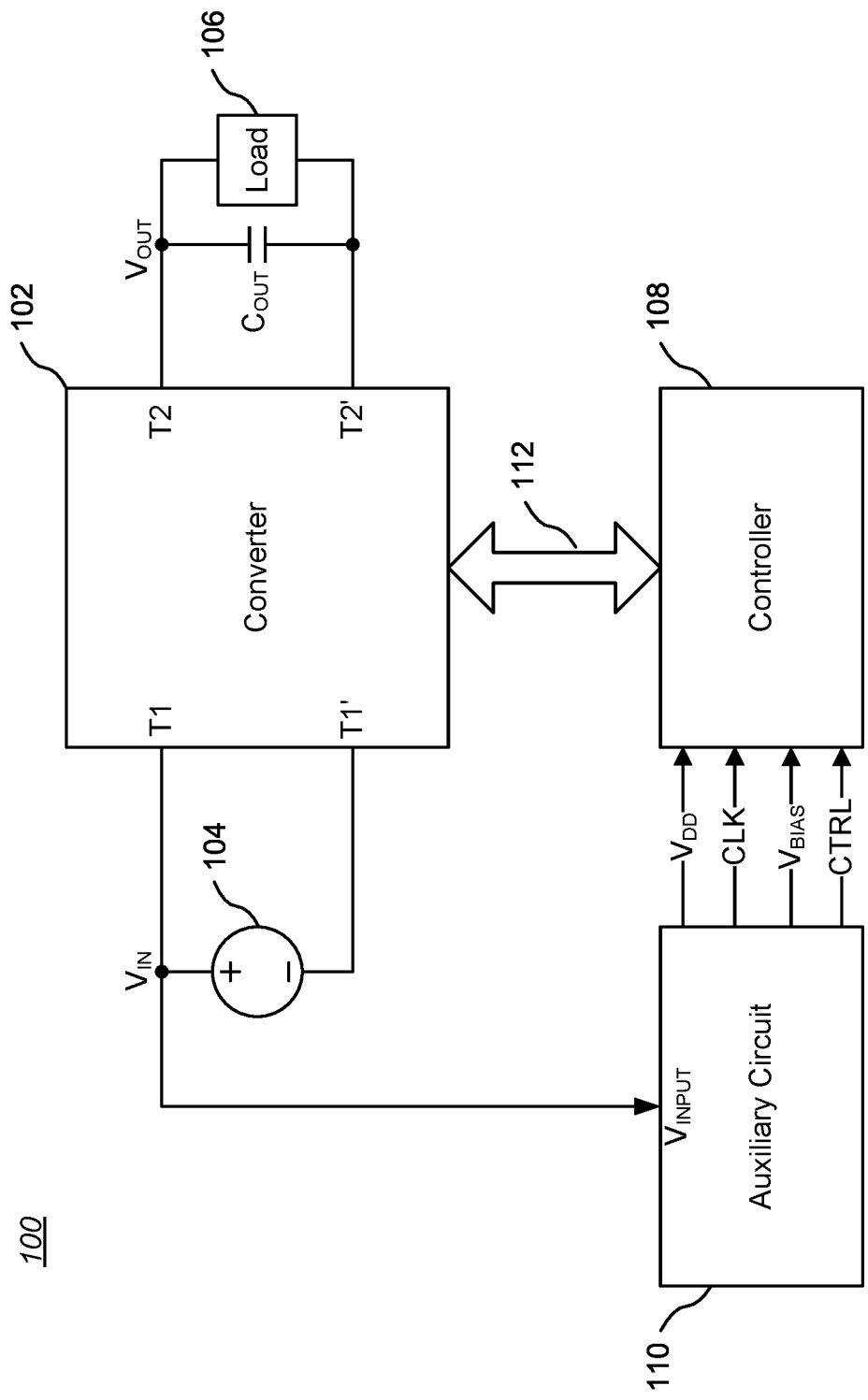
FIG. 1 is a block diagram of a prior art power converter.
Figure 2:
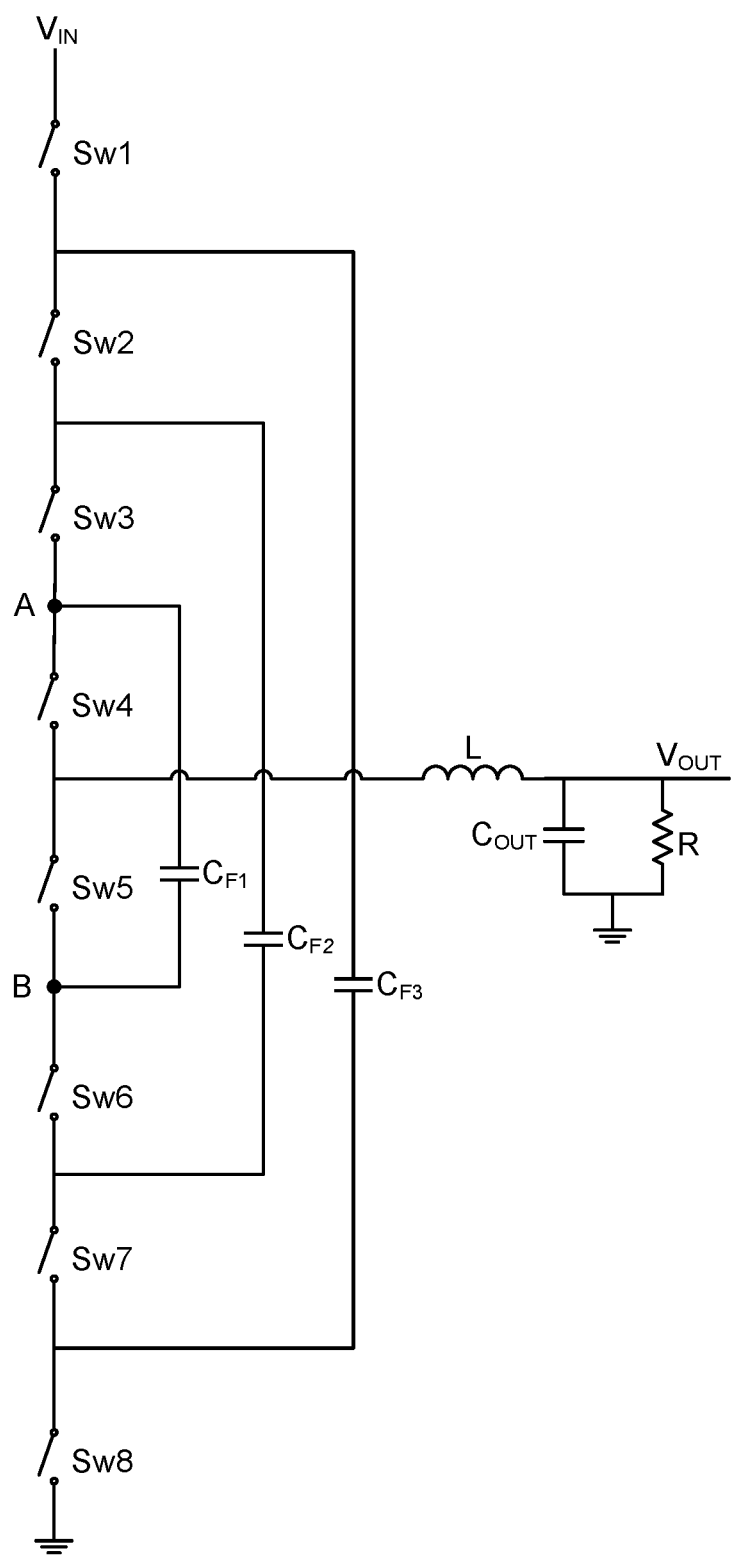
FIG. 2 is a schematic diagram of one type of prior art inductor-based multi-level buck converter circuit that may be used as the converter circuit of FIG. 1.

In the example illustrated in FIG. 3A, the two sets of series-connected power switches, Sw1-Sw4 and Sw5-Sw8 of FIG. 2 are implemented by a set of power FETs Mn (in this example, n=1 . . . 8). The control gate of each power FET Mn is coupled to a corresponding level-shifter/driver (LS/D) circuit 302. A clock signal $\varphi_n$ coupled as an input to each LS/D circuit 302 controls the ON or OFF state of the corresponding power FET Mn. The clock signals may be generated by, for example, the controller 108 shown in FIG. 1.

Power to each LS/D circuit 302 is provided by charge stored on a corresponding bootstrap capacitor Cn (in this example, n=1 . . . 8) coupled to target (shifted) voltage inputs of the LS/D circuit 302, as described in detail below with respect to FIG. 3B. Each bootstrap capacitor Cn should be sized to provide at least sufficient charge, with minimal voltage drop, to allow the LS/D circuit 302 to switch the state of a coupled power FET Mn, the control gates of which are relatively large capacitive structures.

The charge on each bootstrap capacitor $C_1$-$C_7$ is replenished during startup and operation from a corresponding parallel-connected linear regulator 304. In the illustrated embodiment, a linear regulator is omitted for the bottom bootstrap capacitor $C_8$ and corresponding power FET M8, since the bootstrap capacitor $C_8$ can simply be coupled between a supply voltage $V_{DD}$ (e.g., 3.3V) and circuit ground. However, in some embodiments, it may be useful to provide a linear regulator 304 for all bootstrap capacitors. Each power FET M1-M8 and the associated driving circuitry and linear regulator circuitry can be considered as "tier" of the power converter 300.

Figure 3B:
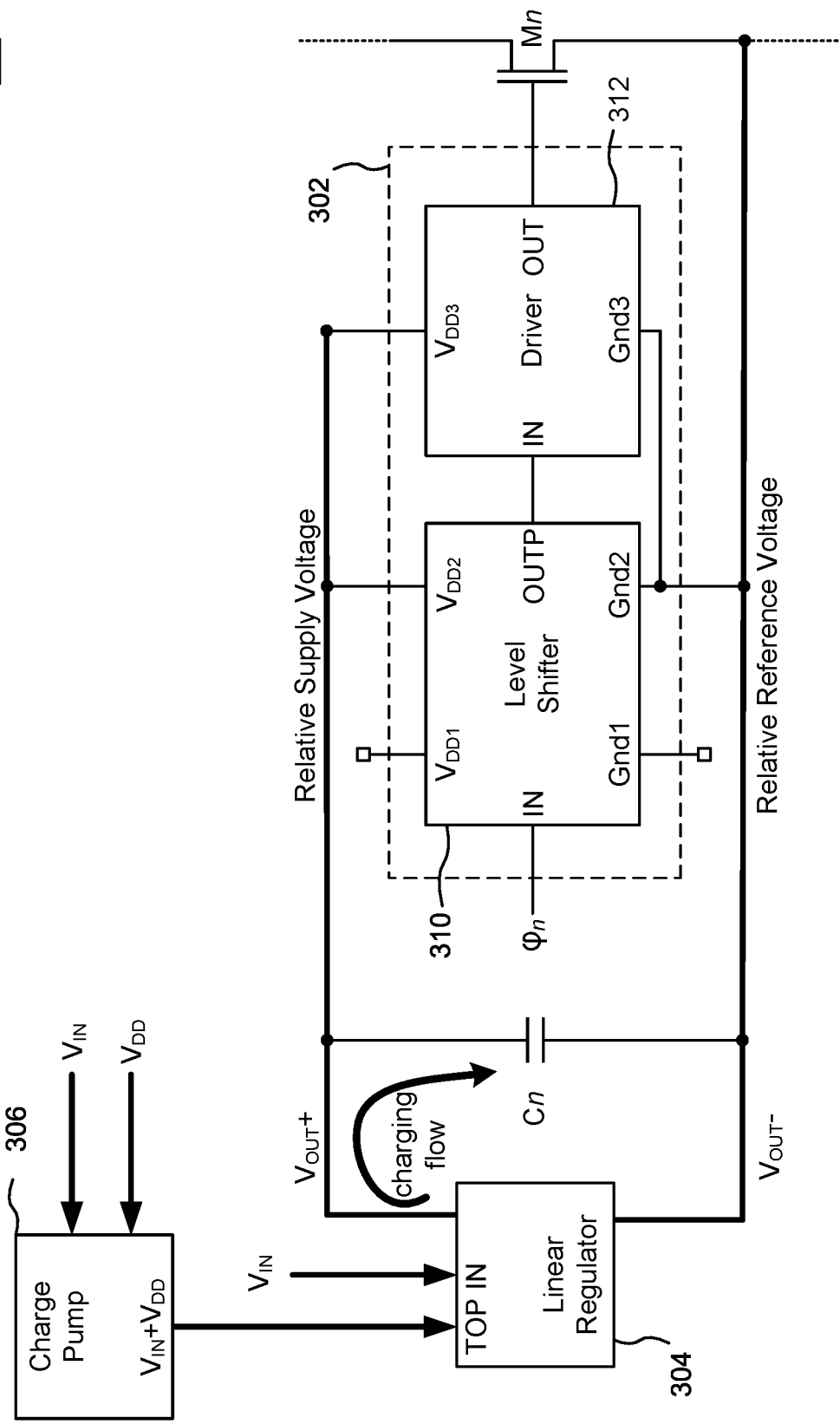
FIG. 3B is a more detailed block diagram of one embodiment of a linear regulator coupled to a bootstrap capacitor Cn and a corresponding LS/D circuit for a power FET Mn.

FIG. 3B is a more detailed block diagram 350 of one embodiment of a linear regulator 304 coupled to a bootstrap capacitor Cn and a corresponding LS/D circuit 302 for a power FET Mn. The linear regulator 304 is shown coupled, via an input TOP, to a charge pump 306 that provides a boosted input voltage of $V_{IN}+V_{DD}$ generated from input voltages $V_{DD}$ (e.g., 3.3V from a controller 108, as shown in FIG. 1) and $V_{IN}$ (i.e., the voltage applied to the input of the power converter 300, such as 3.3V to 14.4V). The boosted voltage $V_{IN}+V_{DD}$ is needed to charge the coupled bootstrap capacitors Cn. The linear regulator 304 is also coupled, via an input IN, to $V_{IN}$ as a reference voltage; thus, the difference in the two input voltages to the linear regulator 304 is $V_{DD}$ (=$V_{IN}+V_{DD}$ minus $V_{IN}$). This difference is used to regulate the voltage on each capacitor Cn to have the same voltage difference but referenced to a lower voltage than $V_{IN}$. Alternatively, if the linear regulator 304 has its own internally generated reference voltage, it then would only need one voltage input, namely $V_{IN}+V_{DD}$, to generator Cn voltages. For each coupled bootstrap capacitor Cn and LS/D circuit 302, the linear regulator 304 provides a suitable Relative Supply Voltage. The linear regulator 304, the bootstrap capacitor Cn, and the LS/D circuit 302 are also coupled to a Relative Reference Voltage defined by the voltage at the source of the corresponding power FET Mn.

Within the LS/D circuit 302, a level shifter 310 receives a corresponding input IN (e.g., a clock signal $\varphi_n$, as shown in FIG. 3A, that controls the ON or OFF state of the corresponding power FET Mn) and converts that input into a level-shifted output OUTP. In the illustrated example, the input signal is a voltage within an input voltage range from $V_{DD}$ to circuit ground, which are respectively applied to the level shifter 310 at terminals $V_{DD1}$ and Gnd1. The shifted voltage range varies between the Relative Supply Voltage provided by the corresponding linear regulator 304 and the Relative Reference Voltage, which are respectively applied to the level shifter 310 at terminals $V_{DD2}$ and Gnd2 (which may also be called "target voltage" terminals).

The Relative Supply Voltage and the Relative Reference Voltage are also coupled to a driver circuit 312 within the LS/D circuit 302 at terminals $V_{DD3}$ and Gnd3. An input IN to the driver circuit 312 receives the level-shifted output OUTP from the level shifter 310 and provides a suitable drive voltage to the control gate of a coupled power FET Mn, in known fashion (note that the drive voltage may be provided through other components, not shown, such as a gate resistor or resistor network).

The linear regulator 304 for each corresponding bootstrap capacitor Cn is set to provide a suitable Relative Supply Voltage to charge the bootstrap capacitor Cn (see the arrow in FIG. 3B indicating charging flow) to a voltage level that provides an adequate, stable source of power and charge to the LS/D circuit 302. For example, the drain of power FET M1 is at $V_{IN}$, which may, for example, range from about 3.3V to about 14.4V in some applications. The required Relative Supply Voltage required to switch that power FET OFF may be about $V_{IN}+\Delta V$, and to switch that power FET ON may be about Vsource+$\Delta V$, where $\Delta V$ is dependent on the type of transistor used for power FET M1; for a commonly used N-type FET, $\Delta V$ may be about 3.3V. Accordingly, the linear regulator 304 corresponding to power FET M1 should be configured to charge the corresponding bootstrap capacitor $C_1$ to 3.3V in the illustrated example. Similarly, the linear regulators 304 corresponding to power FETs M2-M7 should be configured to charge the corresponding bootstrap capacitors $C_2$-$C_7$ to the required Relative Supply Voltage required to switch those power FETs.

In the embodiment shown in FIGS. 3A and 3B, the top node (plate) of each bootstrap capacitor Cn is constantly charged by the output voltage $V_{IN}+V_{DD}$ from the charge pump 306 with the same average current, since the charge needed to replenish the bootstrap capacitors is fixed. The voltage delta from the top-most bootstrap capacitor $C_1$ to the bottom-most bootstrap capacitor $C_8$ varies depending on the ON/OFF state of the power FETs Mn, but in general, there is less voltage drop for the upper bootstrap capacitors and the voltage drop increases for each successive bootstrap capacitor going lower. The power loss per linear regulator 304 would be V×I (totaling 8×V×I in the example shown in FIG. 3A), where V is the voltage drop between $V_{IN}+V_{DD}$ and the top node of each bootstrap capacitor. This voltage drop can be quite large, leading to appreciable loss. For example, for $V_{IN}$=5V and $V_{DD}$=3.3V, the voltage delta between $V_{IN}+V_{DD}$ and the top node of bootstrap capacitor $C_7$ can be as high as 5V. Thus, taking into account the average voltage drop across a power FET Mn (which typically can be a few tenths of a volt across a power FET Mn having an $R_{ON}$ of around 10 ohms), the embodiment shown in FIG. 3A may not be preferred for applications where power savings is an important design criteria.

Figure 3C:
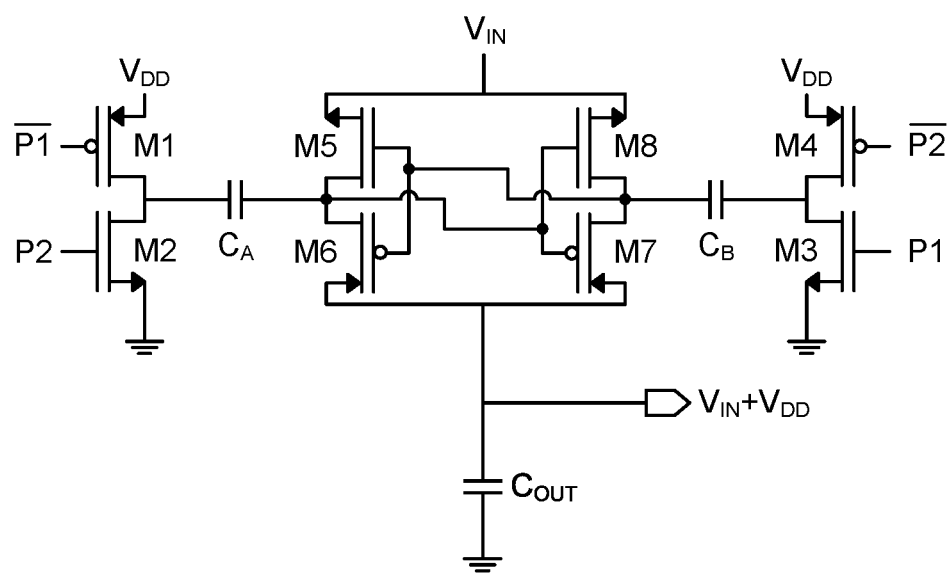
FIG. 3C is a more detailed block diagram of one embodiment of a charge pump.

FIG. 3C is a more detailed block diagram of one embodiment of a charge pump 306. Clock signals P1 and P2 are complementary and non-overlapping phases, while the /P1 and/P2 clock signals are inverted versions of P1 and P2. PFET M1 and NFET M3 conduct and block charge flow at the same times, while NFET M2 and PFET M4 conduct and block charge flow at the same times (but complementary to PFET M1 and NFET M3). FETs M1 and M2 and FETs M4 and M3 are respectively coupled in series between a voltage source $V_{DD}$ and circuit ground. A cross-coupled set of FET pairs (NFET M5 and PFET M6 on the left, NFET M8 and PFET M7 on the right) is coupled between $V_{IN}$ and a capacitor $C_{OUT}$, which in turn is coupled to circuit ground. Toggling of the P1 and P2 clocks signals (and their complementary versions) periodically connects $V_{IN}$ through FETs M5 and M8 to the "top" plates of capacitors $C_A$ and $C_B$, thus charging those capacitors to $V_{IN}$, and then periodically connects $V_{DD}$ through FETs M1 and M4 to the "bottom" plates of capacitors $C_A$ and $C_B$, thus adding $V_{DD}$ on the fly to $V_{IN}$. In greater detail, in a first phase, capacitor $C_A$ is charged to $V_{IN}$ through switches M5 and M2 in closed (ON) states, or capacitor $C_B$ is charged to $V_{IN}$ through switches M8 and M3 in closed states. In a second phase, capacitor $C_A$ is discharged to the output with a voltage of $V_{IN}+V_{DD}$ through switches M1 and M6 in closed states, or capacitor $C_B$ is discharged to the output with a voltage of $V_{IN}+V_{DD}$ through switches M4 and M7 in closed states.

Figure 3D:
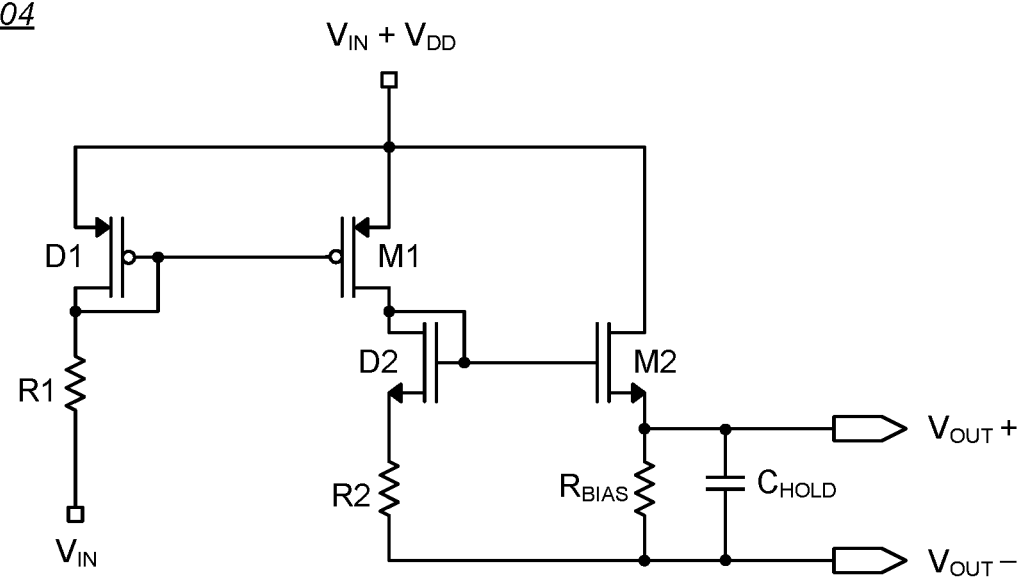
FIG. 3D is a more detailed block diagram of one embodiment of a linear regulator.

FIG. 3D is a more detailed block diagram of one embodiment of a linear regulator 304. Connected between an input voltage $V_{IN}+V_{DD}$ and a reference voltage $V_{IN}$, a diode-connected PFET D1 and resistor R1 provide a source voltage-dependent bias voltage to PFET M1. PFET M1 and diode-connected NFET D2 function as a current mirror to a source-follower NFET M2 having its gate connected in common with the gate of the diode-connected NFET D2. The source-follower NFET M2 is connected between the input voltage $V_{IN}+V_{DD}$ and a bias resistor $R_{BIAS}$, and resistors R2 and $R_{BIAS}$ are coupled to a common rail. The source of NFET M2 provides a regulated output $V_{OUT}+$ (e.g., the Relative Supply Voltage of FIG. 3B) and the common rail connecting resistors R2 and $R_{BIAS}$ provides a regulated output $V_{OUT}-$ (e.g., the Relative Reference Voltage of FIG. 3B) for an associated tier of the power converter 300 of FIG. 3A. Accordingly, the current mirror configuration mirrors the current in R1 to R2 so $V_{R1}=V_{R2}$ if R1=R2. The voltage $V_{R2}$ then gets replicated to $V_{OUT}+/V_{OUT}-$ through the D2/M2 pair of devices. An optional stabilizing capacitor $C_{HOLD}$ may be included in some embodiments, but in other embodiments the associated bootstrap capacitor Cn provides that function (e.g., see FIG. 3B).

Figure 3E:
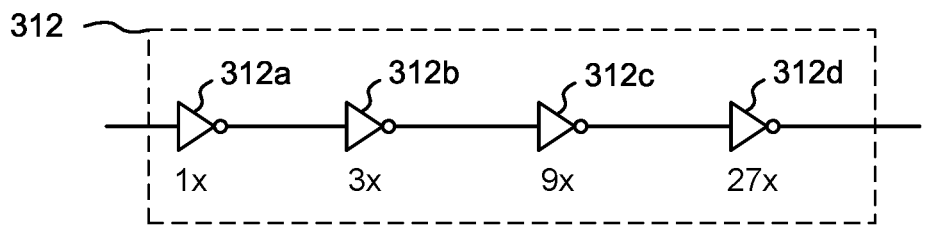
FIG. 3E is a more detailed block diagram of one embodiment of a driver circuit.

FIG. 3E is a more detailed block diagram of one embodiment of a driver circuit 312. In the illustrated embodiment, the driver circuit 312 comprises four series-coupled inverter stages 312a-312d of increasing size (and hence driver power). In alternative embodiments, the number of stages may be fewer or greater, and non-inverting stages (buffer amplifiers) may be used rather than inverting stages. Further, the multipliers for the stages may differ from the 1×, 3×, 9×, and 27× ratios shown.

Floating Charge Circuit Embodiment

An improved bootstrap power supply for bootstrap capacitors and level-shifter and driver circuits of a FET-based power converter uses a successive bootstrap capacitor charge transfer technique which can minimize power loss during charge transfer and thereby maximize the efficiency of the power converter.

A. Example Embodiment Circuit Details

Figure 4A:
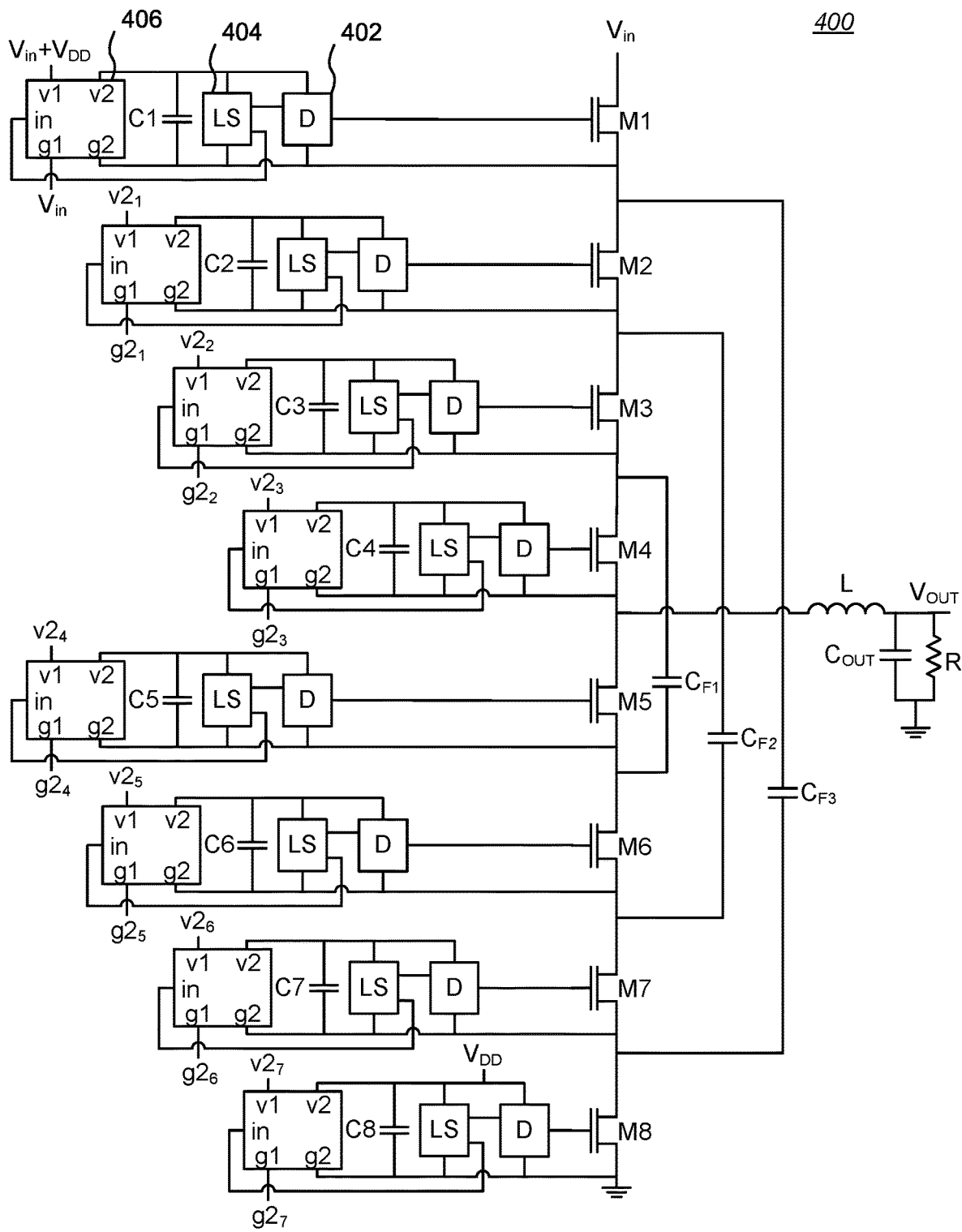
FIG. 4A is a block diagram of one embodiment of a FET-based buck power converter utilizing floating charge circuits and bootstrap capacitors to provide an improved bootstrap power supply for level-shifter and driver circuits.
Figure 4B:
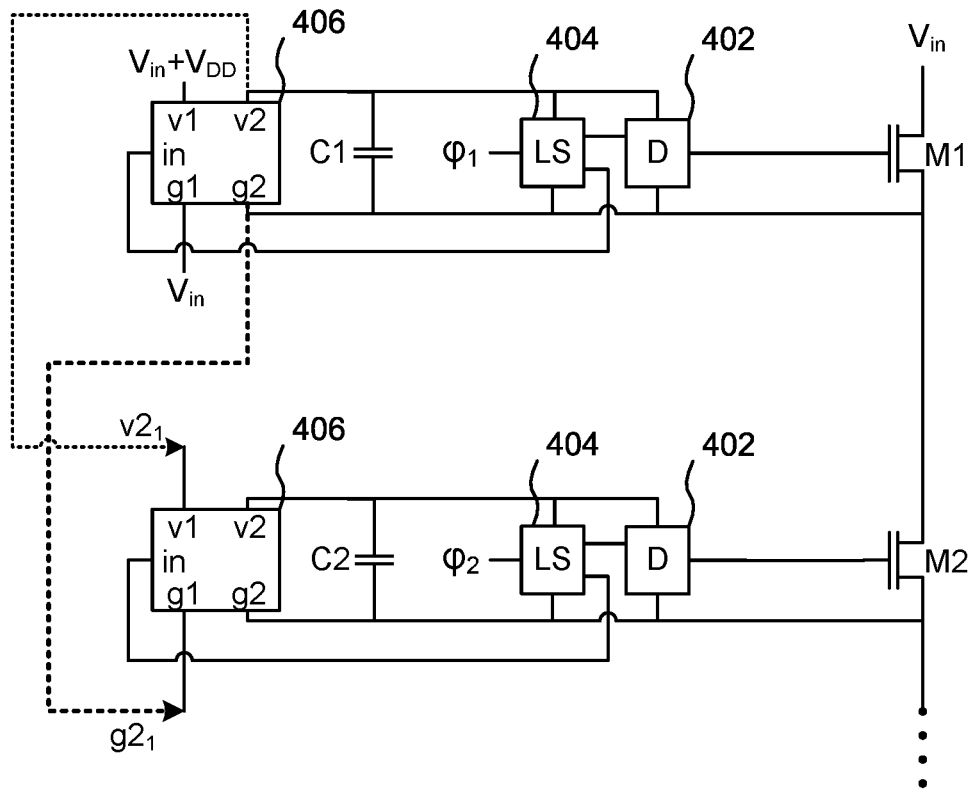
FIG. 4B is a block diagram showing one example of connecting the floating charge circuit of a first tier to the floating charge circuit of a next tier.

FIG. 4A is a block diagram of one embodiment of a FET-based buck power converter 400 utilizing floating charge circuits and bootstrap capacitors to provide an improved bootstrap power supply for level-shifter and driver circuits (to avoid clutter, note that reference numbers have not been applied to all similar components of the power converter 400 and the clock signals $\varphi_n$ shown in FIG. 3B and the controller 108 shown in FIG. 1 have been omitted). FIG. 4B, described below, shows a magnified view of two tiers of FIG. 4A in greater detail.

In the example illustrated in FIG. 4A, the two sets of series-connected power switches, Sw1-Sw4 and Sw5-Sw8 of FIG. 2 are again implemented by power FETs M1-M8. The control gate of each power FET Mn is coupled to a corresponding driver circuit 402. Each driver circuit 402 is controlled by a corresponding dual-output level-shifter circuit 404, described in detail below with respect to FIGS. 4C-4E. Power to each driver circuit 402 and dual-output level-shifter circuit 404 is provided by charge stored on a corresponding bootstrap capacitor Cn. Each bootstrap capacitor Cn should be sized to provide at least sufficient charge to allow the driver circuit 402 to switch the state of a coupled power FET Mn.

Each set of circuits comprising a driver circuit 402, a dual-output level-shifter circuit 404, and a bootstrap capacitor Cn is coupled to a floating charge circuit 406. Each FET M1-M8 and such associated driving circuitry and charge circuitry can be considered as a "tier" of the power converter 400. For example, the first tier of the power converter 400 includes FET M1 and the following labeled components: the driver circuit 402, the dual-output level-shifter circuit 404, the bootstrap capacitor C1, and the floating charge circuit 406.

Each floating charge circuit 406 has a power input v1 and a first reference input g1, and a power output v2 and second reference input g2. For the top-most floating charge circuit 406, the power input v1 is coupled to $V_{IN}+V_{DD}$ (e.g., from a charge pump 306 such as shown in FIG. 3B) and the first reference input g1 is coupled to $V_{IN}$. However, for each lower floating charge circuit 406, the power input v1 and the first reference input g1 are respectively coupled to the power output v2 (and thus to the top plate of the corresponding bootstrap capacitor Cn) and the second reference input g2 (and thus to the bottom plate of the corresponding bootstrap capacitor Cn) of the next higher floating charge circuit 406, in a cascaded architecture. For example, FIG. 4B is a block diagram 420 showing one example of connecting the floating charge circuit 406 of a first tier to the floating charge circuit 406 of a next tier. For the floating charge circuit 406 associated with power FET M2, the power input v1 and the first reference input g1 of the floating charge circuit 406 are respectively coupled to the power output v2 (denoted $v2_1$) and the second reference input g2 (denoted $g2_1$) of the floating charge circuit 406 associated with power FET M1. Accordingly, the floating charge circuit 406 associated with power FET M2 is also coupled to bootstrap capacitor $C_1$. A controller 422, which may be separate from or part of the controller 108 shown in FIG. 1, provides respective clock signals $\varphi_1$-$\varphi_n$ to the level shifters 404 in the set of tiers. In normal operation, the clock signals $\varphi_1$-$\varphi_n$ provide periodic ON or OFF signals to the level shifters 404, and may have a controllable duty cycle. In addition, for some scenarios, such as startup, the controller 422 may force some or all of the clock signals $\varphi_1$-$\varphi_n$ to specific ON or OFF states for some duration of time or until some event occurs (e.g., the charge across the associated bootstrap capacitors $C_1$-$C_7$ has reached some target level).

In preferred embodiments, the floating charge circuits 406 perform two functions. First, before the power FETs Mn can start switching, the floating charge circuits 406 provide a circuit path through which the bootstrap capacitors Cn are pre-charged to $V_{MIN}$, where $V_{MIN}$ is the minimum voltage (e.g., about 2V) needed for the gate driver circuits 402 to work in a particular embodiment (note that in some embodiments, the bottom bootstrap capacitor $C_8$ is coupled to $V_{DD}$, and hence can be charged to $V_{MIN}$ from that power source). Second, during normal operation, the floating charge circuits 406 provide a circuit path through which the charge on a bootstrap capacitor Cn is rebalanced when the corresponding power FET Mn turns ON. For example, the charge on bootstrap capacitor C1 is rebalanced when power FET M1 is ON, the charge on bootstrap capacitor C2 is rebalanced when power FET M2 is ON, and so forth.

Figure 4C:
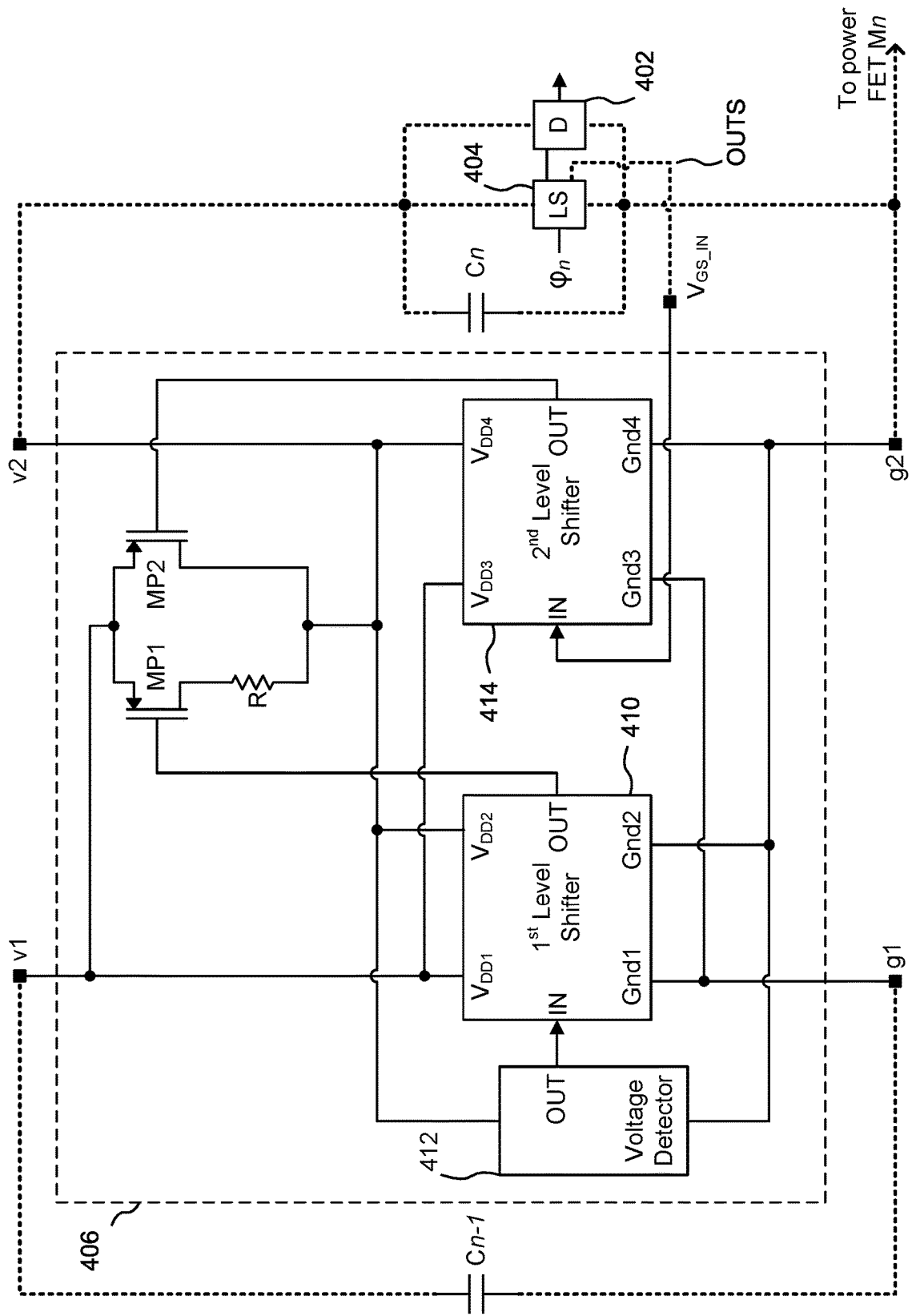
FIG. 4C is a block diagram showing the internal circuitry of one embodiment of a floating charge circuit.

FIG. 4C is a block diagram showing the internal circuitry of one embodiment of a floating charge circuit 406. Note that in this figure, components external to the floating charge circuit 406 are shown connected by dotted lines, indicating externality, not optionality. A first sub-circuit includes a P-type FET MP1 coupled in series with a resistor R and controlled by a first level shifter 410, which in turn is controlled by a voltage detector 412. The resistor R limits the maximum current level that can flow through FET MP1.

As should be clear, other components that can limit current may be used in place of, or in conjunction with, the resistor R. A second sub-circuit includes a P-type FET MP2 controlled by a second level shifter 414, which in turn is controlled by a control signal, $V_{GS\_IN}$, from the level shifter 404 that is coupled to the driver circuit 402 that drives the associated power FET Mn (not shown). The output of the driver circuit 402 is coupled to the control gate of a corresponding power FET Mn (as shown in FIG. 4A).

The power input v1 of the floating charge circuit 406 is coupled to the respective sources of the FETs MP1 and MP2, to a $V_{DD1}$ terminal of the first level shifter 410, and to a $V_{DD3}$ terminal of the second level shifter 414. The power output v2 of the floating charge circuit 406 is coupled to the respective drains of the FETs MP1 (through the resistor R) and MP2, to a $V_{DD2}$ terminal of the first level shifter 410, to a $V_{DD4}$ terminal of the second level shifter 414, and to the voltage detector 412.

The first reference input g1 of the floating charge circuit 406 is coupled to a Gnd1 input of the first level shifter 410 and to a Gnd3 input of the second level shifter 414. The second reference input g2 of the floating charge circuit 406 is coupled to a Gnd2 input of the first level shifter 410, to a Gnd4 input of the second level shifter 414, and to the voltage detector 412.

The corresponding bootstrap capacitor Cn, level shifter 404, and driver circuit 402 are also coupled in parallel with the power output v2 and second reference input g2 of the floating charge circuit 406. The second reference input g2 of the floating charge circuit 406 is also coupled to the source of the corresponding power FET Mn, as shown in FIG. 4A.

The first level shifter 410 and the second level shifter 414 within the floating charge circuit 406 are conventional level shifters in which the input is level-shifted at the output. The voltages applied at $V_{DD1}$ and $V_{DD3}$ should be greater than or equal to the respective target voltages $V_{DD2}$ and $V_{DD4}$. Similarly, voltage at the first reference inputs (Gnd1 and Gnd3) should be greater than or equal to the respective voltage at the second reference inputs (Gnd2 and Gnd4).

As noted above with respect to FIG. 4A, the power input v1 and the first reference input g1 of each floating charge circuit 406 (except for the top tier) are also coupled to the bootstrap capacitor of the previous (next higher) tier. For example, if the floating charge circuit 406 shown in FIG. 4C is coupled across bootstrap capacitor Cn, then the associated power input v1 and the first reference input g1 are coupled across bootstrap capacitor Cn-1 (equivalent to being coupled to the power output v2 and second reference input g2 of the floating charge circuit 406 of the immediately upper tier, as shown in FIG. 4A). For the top tier, corresponding to power FET M1, the power input v1 and the first reference input g1 of the floating charge circuit 406 are respectively coupled to $V_{IN}+V_{DD}$ and to $V_{IN}$. In some embodiments, in the bottom tier (corresponding to power FET M8 in this example), the power output v2 and the second reference input g2 of the floating charge circuit 406 are respectively coupled to $V_{DD}$ and to circuit ground.

Figure 4D:
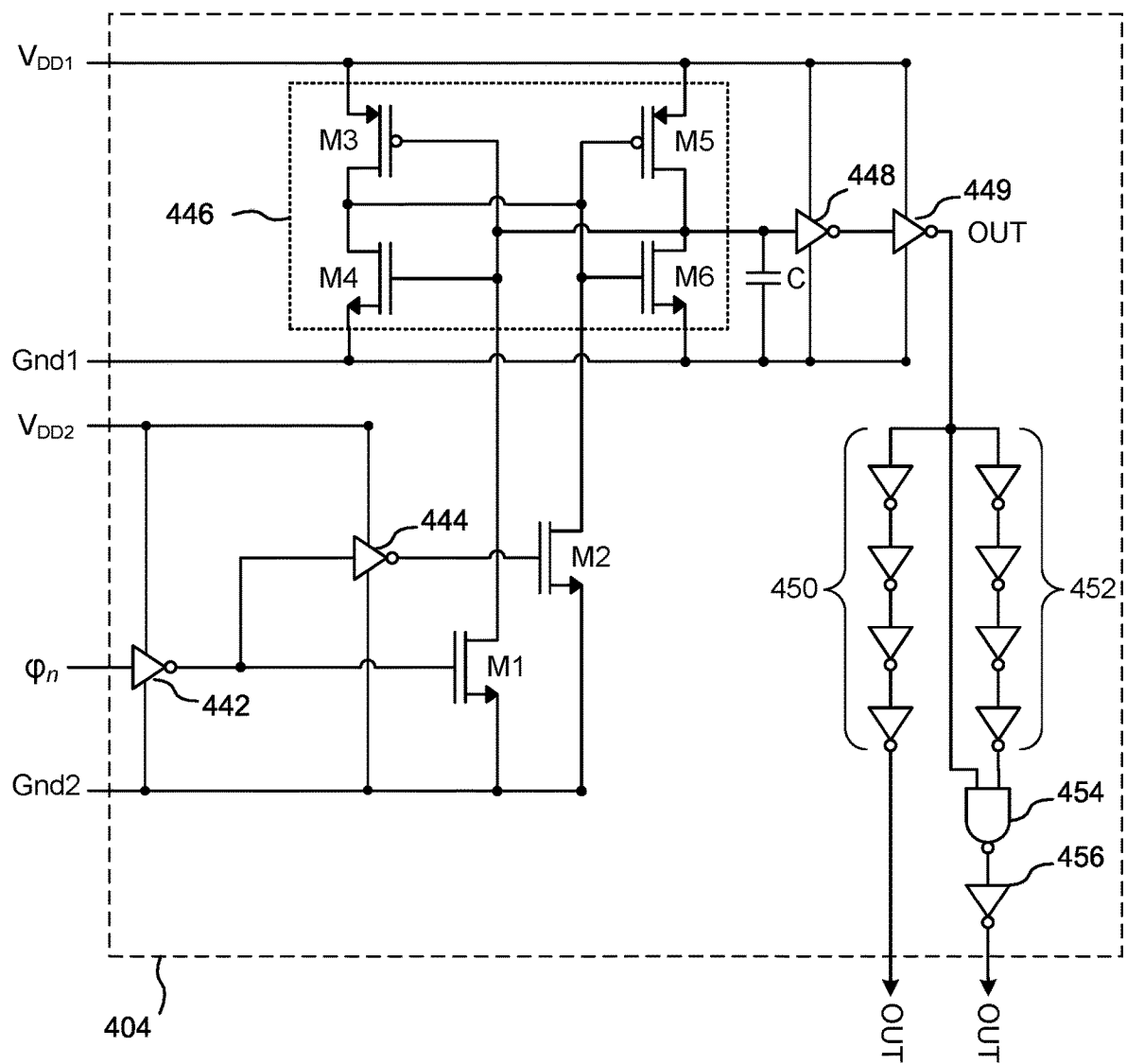
FIG. 4D is a schematic diagram of one embodiment of a level shifter that may be used in the circuit of FIG. 4C.

FIG. 4D is a schematic diagram of one embodiment of a level shifter 404 that may be used in the circuit of FIG. 4C. A lower level of circuitry is coupled between $V_{DD2}$ and Gnd2, and an upper level of circuitry is coupled between $V_{DD1}$ and Gnd1. $V_{DD1}$ and Gnd1 can be at the same or higher voltages with respect to $V_{DD2}$ and Gnd2. In the lower level, a clock signal $\varphi_n$ may be applied as an input to a first buffering inverter 442 powered by $V_{DD2}$. The output of the first buffering inverter 442 controls the gate of a FET M1 and is also coupled to a second buffering inverter 444 powered by $V_{DD2}$, which in turn controls the gate of a FET M2. FETs M1 and M2 are thus complementary.

In the upper level of circuitry, FETs M3, M4, M5, and M6 form a latch 446, the output of which is coupled to an inverter 448, which in turn is coupled to an inverter 449 which provides a level-shifted control signal output OUT. Since FETs M1 and M2 are complementary, when one is ON (conducting), the other is OFF (blocking). Thus, FET M1 turning ON sets OUT low, while FET M2 turning ON sets OUT high. Note that, in general, the pull-down strength of FETs M1 and M2 needs to be much higher than FETs M3 and M5 to flip the state of the latch 446.

The control signal output OUT of the main level shifter circuitry may be used directly as the control signal "OUTP" in the circuit of FIG. 3B. However, for the level shifter 404 shown in FIGS. 4A-4C, a special delayed control signal is desirable for application to the input of the second level shifter 414 of the corresponding floating charge circuit 406 in FIG. 4C. Accordingly, the OUT signal is applied to a first delay line 450 (shown as comprising 4 series-coupled inverters; fewer or more may be used in a particular application). The output of the first delay line 450 is OUTP, which may be applied to the input of an associated driver circuit 402 in FIGS. 4A-4C.

The OUT signal is also applied to a second delay line 452 (shown as comprising 4 series-coupled inverters; fewer or more may be used in a particular application) and to a first input of a NAND gate 454. The output of the second delay line 452 is coupled to a second input of the NAND gate 454. The output of the NAND gate 454 is applied to inverter 456, the output of which is an OUTS control signal. When OUT goes high, the second delay line 452, the NAND gate 454, and the inverter 456 will delay OUTS from going high until sometime after OUTP goes high. However, when OUT goes low, the output of the NAND gate 454 will quickly go high, meaning that the output of the inverter (OUTS) will quickly go low before OUTP from the first delay line 450 can go low. Note that the number of inverters used in the first delay line 450 and the second delay line 453 are only to show a relative delay between the different paths. The actual number of inverters may vary to provide proper delays for optimal circuit function.

Figure 4E:
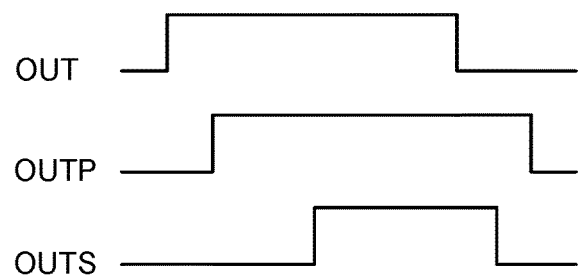
FIG. 4E is timing diagram of OUT, OUTP, OUTS from FIG. 4D.

FIG. 4E is timing diagram of OUT, OUTP, and OUTS from FIG. 4D. As shown, OUTP and OUTS go high a delayed time after OUT goes high, and go low a delayed time after OUT goes low. In addition, OUTS goes high after OUTP goes high, and OUTS goes low shortly before OUTP goes low; thus, when asserted, OUTS is nested within the waveform of the asserted OUTP.

Figure 4F:
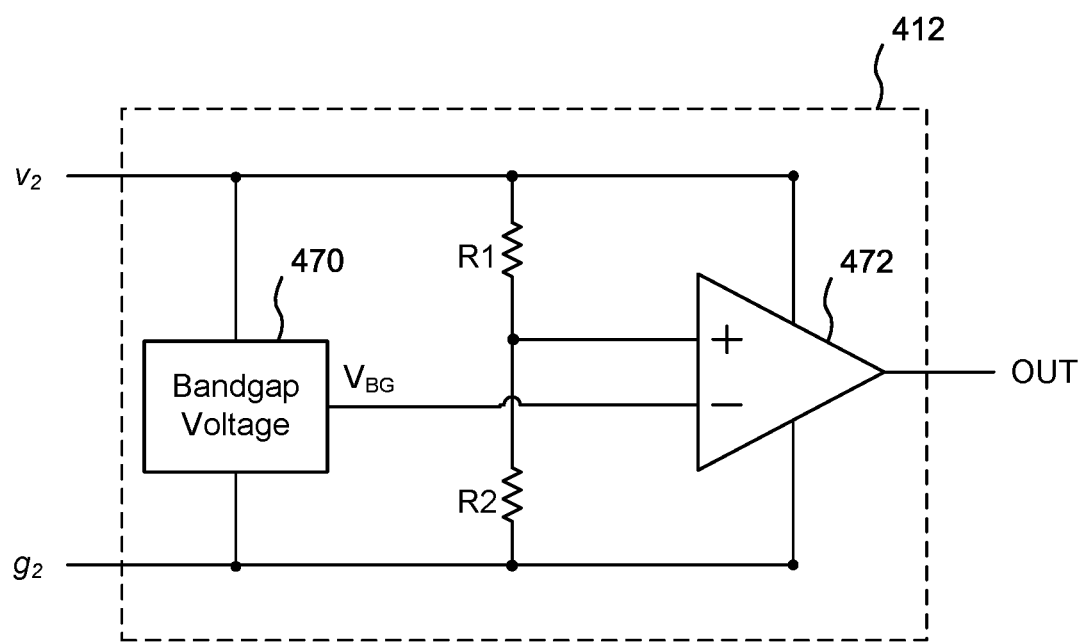
FIG. 4F is a block diagram of one embodiment of the voltage detector.

FIG. 4F is a block diagram of one embodiment of the voltage detector 412, as previously described/shown in FIG. 4C. The voltage detector 412 senses the voltage across the v2 and g2 terminals of the floating charge circuit 406 with respect to a reference voltage that represents the minimum voltage for the gate driver circuit 402 to work. In the illustrated example, a bandgap voltage generator 470 provides a reference voltage $V_{BG}$ to a first input of a comparator 472. Resistors R1 and R2 are series coupled as a voltage divider between the v2 and g2 terminals of the floating charge circuit 406, to scale the voltage from the v2 terminal to the input range of the comparator 472. The output OUT of the voltage detector 412 is asserted by the comparator 472 when the sensed scaled voltage across the v2 and g2 terminals is above $V_{BG}$. The desired voltage $V_{MIN}$ at which OUT is asserted can be set by choosing the values of R1 and R2 such that $V_{MIN}=V_{BG}/[R2/(R1+R2)]$.

B. Startup Mode

During startup of the power converter 400 before the power FETs Mn start switching, the bootstrap capacitors Cn (only $C_1$ to $C_7$ in the example of FIG. 4A) are pre-charged to $V_{MIN}$ by the first sub-circuit of the corresponding floating charge circuit 406 with the following progression of events. Initially, FET MP1 is ON (conductive) in each floating charge circuit 406 of all of the tiers (except the last tier in some embodiments). The charge pump 306 (which turns ON at the beginning and operates concurrently with pre-charging of the bootstrap capacitors to $V_{MIN}$) begins to generate the $V_{IN}+V_{DD}$ voltage, which is applied to the power input v1 of the top tier floating charge circuit 406. Meanwhile, the power FETs Mn remain OFF due to low gate-source voltages ($V_{GS}$). Since FET MP1 is conductive, the $V_{IN}+V_{DD}$ voltage applied at the power input v1 of the top tier floating charge circuit 406 will flow through FET MP1 and the resistor R and thus charge the corresponding bootstrap capacitor $C_1$ of the top tier, which is coupled to the power output v2 and second reference input g2 of the top tier floating charge circuit 406. The presence of the resistor R (or other current-limiting component) limits in-rush current that might damage circuitry in the various tiers.

Because of the cascaded architecture of the power converter 400, the input voltage applied to the floating charge circuit 406 of the top tier also flows through lower tiers and charges the respective bootstrap capacitor Cn of those tiers. For example, bootstrap capacitor $C_1$ is coupled to the v1 and g1 terminals of the floating charge circuit 406 of the second tier. Since FET MP1 of the second tier is also conductive during startup, charge from bootstrap capacitor $C_1$ will flow into bootstrap capacitor $C_2$. Similarly, charge will cascade down through all successive floating charge circuits 406 to pre-charge their corresponding bootstrap capacitor Cn (as noted above, in some embodiments, the last bootstrap capacitor may be directly pre-charged by $V_{DD}$).

Once the voltage detector 412 in a tier senses that the voltage between v2 and Gnd2 of the corresponding floating charge circuit 406 exceeds $V_{MIN}$ (which reflects that a minimum charge has accumulated on the associated bootstrap capacitor Cn), the voltage detector 412 asserts a control signal to an IN port of the associated first level shifter 410, which in response asserts a gate control signal from an OUT port coupled to the control gate of FET MP1, which turns FET MP1 OFF. In embodiments in which the bootstrap capacitor of the last tier ($C_8$ in this example) is tied to $V_{DD}$—which is above $V_{MIN}$—the FET MP1 of the bottom-most floating charge circuit 406 will be forced OFF at the beginning of the startup phase by the corresponding voltage detector 412 and first level shifter 410 since the corresponding bootstrap capacitor is pre-charged. Once the bootstrap capacitor Cn in each tier reaches at least $V_{MIN}$, the pre-charging function of the floating charge circuits 406 is complete.

In essence, the first sub-circuit of a floating charge circuit 406 in each tier provides a current-limited pre-charging pathway through the floating charge circuit 406 to a next floating charge circuit 406 in an adjacent tier. By tying the top tier to a boosted power supply, $V_{IN}+V_{DD}$, charge will flow through all tiers until the associated bootstrap capacitor Cn in each tier is charged to $V_{MIN}$.

C. Operational Mode

Once all bootstrap capacitor Cn are charged to a voltage at or above $V_{MIN}$, thereby providing sufficient $V_{GS}$ levels for the power FETs Mn, the power FETs Mn start to toggle in response to control signals applied to the corresponding level shifter 404 and driver circuit 402 (e.g., a clock signal $\varphi_n$ that controls the ON or OFF state of the corresponding power FET Mn). In this operational mode, the bootstrap capacitors Cn are periodically rebalanced by the pathways enabled by the second sub-circuit of the corresponding floating charge circuit 406.

For example, while power FET M1 in the first tier is in an OFF state, the second level shifter 414 in the corresponding floating charge circuit 406 will hold FET MP2 in a non-conducting OFF state. When the associated control signal to the corresponding level shifter 404 (e.g., a clock signal $\varphi_1$) causes OUTP to be asserted, power FET M1 toggles to a conducting ON state. As a result of turning power FET M1 ON, the charge on the corresponding bootstrap capacitor $C_1$ is partially depleted. Accordingly, charge will transfer from $V_{IN}+V_{DD}$ (applied to v1 of the corresponding floating charge circuit 406) to the bootstrap capacitor $C_1$ through FET MP2 and replenish the charge lost to charging/discharging the control gate of power FET M1 as well as its associated level shifter/gate driver circuitry.

When the nested logic-level output OUTS of the level shifter 404 corresponding to power FET M1 is asserted and applied to an IN port of the associated second level shifter 414, a gate control signal $V_{GS\_IN}$ is asserted from an OUT port of the associated second level shifter 414 coupled to the control gate of FET MP2, which switches FET MP2 to a non-conducting (OFF) state. In general, it is desirable that OUTS be de-asserted before the corresponding power FET M1 is turned OFF, as shown by the timing diagram in FIG. 4E.

Viewed another way, FET MP1 turns ON whenever the voltage on its corresponding capacitor Cn is below a pre-determine threshold, and turns OFF when the Cn voltage is at or above a desired level (for example, such as turning ON below 2.2V and turning OFF at or above 2.2V), regardless of the state of the associated FET Mn. On the other hand, FET MP2 turns ON shortly after the associated FET Mn turns ON, and turns OFF shortly before the associated FET Mn turns OFF. Because the state of FET MP1 is independent of state of the associated FET Mn, the voltage drop across FET MP1 and the resistor R can be as high as the VDs voltage of the associated FET Mn when OFF. This voltage can be large so the resistor R or other current limiter serves to limit the maximum current level that can flow through FET MP1. In normal operation, FET MP1 almost never turns ON because each bootstrap capacitor will be charged to near $V_{DD}$ level by the MP2 path. By choosing $V_{MIN}$ to be sufficiently below $V_{DD}$ (e.g., 2.2V versus 3.3V), the MP1 path is kept OFF during normal operation.

Because of the cascaded interconnection of power connections throughout the tiers, charge will transfer from bootstrap capacitor $C_1$ to bootstrap capacitor $C_2$ when power FET M2 is ON, from bootstrap capacitor $C_2$ to bootstrap capacitor C3 when power FET M3 is ON, and so forth. For example, terminals v2 and g2 of tier 1 (corresponding to power FET M1) are respectively coupled to terminals v1 and g1 of tier 2 (corresponding to power FET M2), and accordingly the charge on bootstrap capacitor $C_1$ can transfer to bootstrap capacitor $C_2$ when FET MP2 in tier 2 is conducting.

In the embodiment illustrated in FIG. 4A, the bottom tier is tied to $V_{DD}$ and circuit ground, and accordingly bootstrap capacitor $C_8$ is charged from $V_{DD}$. Thus, while the upper tiers transfer charge downward from tier 1, simultaneously charge is transferred upward from the bottom tier (corresponding to power FET M8 in this example). Thus, when power FET M8 is ON, charge will transfer from bootstrap capacitor $C_8$ to bootstrap capacitor $C_7$, and when power FET M7 is ON, charge will transfer from bootstrap capacitor $C_7$ to bootstrap capacitor $C_6$, and so forth. In other embodiments in which the bottom tier is not tied to $V_{DD}$, charge will only transfer downward, from tier 1 to the last tier.

In essence, during charge transfer, the two bootstrap capacitors in adjacent tiers are periodically connected through the second sub-circuit of the floating charge circuit 406 in one of those tiers, allowing charge to be equalized (rebalanced) between the two bootstrap capacitors.

Note that terminal $V_{DD2}$ of the first level shifter 410 in FIG. 4C may function as either an input or an output. While terminal $V_{DD2}$ is nominally an output, for the case where the lowest tier FET driver circuit 402 is powered from $V_{DD}$ (e.g., as in FIG. 4A), once normal operation starts, $V_{DD2}$ can become an input that feeds current flowing through FET MP2 to terminal $V_{DD1}$, which will charge the bootstrap capacitor in the tier immediately above the lowest tier and continue to ripple up to higher tiers in the same manner. Basically, when FET MP2 in the floating charge circuit 406 of the lowest tier is ON, the capacitor charge equalizes and charge flows from the higher voltage capacitor to the lower voltage capacitor, which dictates the direction of the charge flow.

In the embodiment shown in FIG. 4A, in which the bottom tier is connected to $V_{DD}$ and circuit ground, the charge on each bootstrap capacitor Cn in the remaining seven tiers is rebalanced through FETs MP2. Those FETs have an $R_{ON}$ which can be on the order of a few ohms to tens of an ohm, depending on the size of the FETs. Power loss essentially will be the conduction loss and is $I^2 \times R_{ON}$ per bootstrap capacitor Cn (totaling $7 \times I^2 \times R_{ON}$ in the example shown in FIG. 4A), where I is the average current (there is also gate capacitance switching loss from turning FET MP2 ON or OFF, but that loss is much less than the conduction loss of FET MP2). Another factor that influences power loss is the value of the capacitors Cn. Larger Cn values would reduce the power loss due to FET MP2 ON resistance, which is the same power loss due to capacitor charge redistribution loss, which follows the equation, $\frac{1}{4}C_n(V_1^2+V_2^2-2V_1V_2)$, where $V_1$ and $V_2$ are the two coupled adjacent capacitor initial voltages (i.e., before FET MP2 turns ON and equalizes the two voltages). As can be seen from the equation, larger capacitor values are preferred to minimize the voltage difference between $V_1$ and $V_2$, which minimizes the power loss. Further, during the operational mode, there is essentially no power loss in the floating charge circuit 406 while FET MP2 is OFF and thus not passing charge for rebalancing (as noted above, because the associated Cn voltage should be above $V_{MIN}$ during normal operation, FET MP1 should be held in the OFF state, thereby incurring essentially no power loss). Compared to the architecture shown in FIG. 3A, the power saving for the architecture shown in FIG. 4A is expected to be 2 to 5 times or more. A higher $V_{IN}-V_{SS}$ voltage would increase the power loss for the architecture of FIG. 3A, while the power loss for the architecture in FIG. 4A should be relatively constant as a function of $V_{IN}-V_{SS}$. $V_{SS}$ is the source voltage of FET M8 in FIG. 3A, which is ground; for the case of an inverting buck-boost power converter, $V_{SS}$ can be a negative voltage.

Other Benefits

In some embodiments of the architecture in FIG. 4A, a relatively large charge pump 306 is used to generate $V_{IN}+V_{DD}$ in order to charge all or some of the bootstrap capacitors Cn in a "top-rippling-down" fashion during both startup and normal operation. A relatively large charge pump circuit is needed because high efficiency is desirable during normal operation. In general, such a charge pump would require a relatively large circuit area, additional package pins, and relatively large external capacitors. Using a charge pump to constantly generate $V_{IN}+V_{DD}$ also incurs some power loss during all modes of operation.

As shown in the example of FIG. 4A, a separate supply ($V_{DD}$) may be used to power the lowest tier. An added benefit of the architecture in FIG. 4A for buck power converters is that charge transfer between adjacent capacitors Cn can take place from $V_{IN}+V_{DD}$ rippling down from the top tier and/or from $V_{DD}$ rippling up from the bottom tier. Accordingly, the $V_{IN}+V_{DD}$ charge pump 306 can be disabled in the normal operational mode since the path at the bottom tier from the $V_{DD}$ source enables charge transfer to ripple up through all of the tiers to the top tier. The result would be power loss from the charge pump 306 only during startup of the power converter, leading to an overall reduction in power loss for the power converter as a whole.

Thus, in some buck converter embodiments, the charge pump 306 can be realized as a much smaller charge pump using smaller on-chip charge pump capacitors to generate $V_{IN}+V_{DD}$ only during startup mode to power the bootstrap capacitors Cn to a minimum required level of voltage. Then during normal operation, the charge pump is disabled and all bootstrap capacitors are charged from $V_{DD}$ by the "bottom-rippling-up" charge flow. This approach would have the benefit of eliminating the need for external charge pump capacitors and extra package pins. There may also be a layout area savings from the reduced charge pump size, but this area saving may be somewhat offset by the use of on-chip capacitors. However, depending on the type of on-chip capacitors used—for example, if metal capacitors are used that are located on top of charge pump active circuits—the total layout area savings may still be realized if the capacitor area is not too large.

OTHER EMBODIMENTS

It should be appreciated that while the examples shown in FIGS. 3A and 4A are 5-level buck power converters, the inventive concepts may be used in conjunction with other multi-level power converters (e.g., 3-level, 4-level, n-level).

The inventive concepts also may be used in conjunction with boost power converters. For example, the architecture shown in FIG. 4A can be transformed to a 5-level boost topology by treating the $V_{IN}$ as the $V_{OUT}$ terminal, and the $V_{OUT}$ terminal as the $V_{IN}$ terminal (i.e., by switching the functions of the illustrated terminals).

The inventive concepts also may be used in conjunction with inverting buck-boost power converters. Inverting buck-boost power converters generate an inverted output voltage which can range from near 0V down to very large negative voltages, subject to transistor operational voltage limits. For example, the architecture shown in FIG. 4A can be transformed to a 5-level inverting buck-boost topology by switching the power FETs Mn in certain patterns and not tying the bottom tier floating charge circuit 406 and corresponding bootstrap capacitor $C_8$ to $V_{DD}$. In addition, the $V_{OUT}$ terminal would be coupled to circuit ground, and the illustrated ground terminal would become $V_{OUT}$. In such a configuration, rebalancing charge flows only one way, from the top tier to the bottom tier.

As noted above with respect to FIG. 4C, FET MP1 in each floating charge circuit 406 of all of the tiers (except the last tier in some embodiments) is initially ON (conductive) and stays ON until the voltage detector 412 in a tier senses that the voltage between v2 and Gnd2 of the corresponding floating charge circuit 406 exceeds $V_{MIN}$ (which reflects that a minimum charge has accumulated on the associated bootstrap capacitor Cn), at which time the voltage detector 412 asserts a control signal to an IN port of the associated first level shifter 410, which in response asserts a gate control signal from an OUT port coupled to the control gate of FET MP1, which turns FET MP1 OFF. Thus, FET MP1 in each floating charge circuit 406 is effectively in parallel with a corresponding power FET M1 of the power converter 400. This characteristic can be used in alternative embodiments to omit the charge pump otherwise required to provide power to the top-most floating charge circuit 406.

Pre-Charging Embodiment

In a variation of the power converter architecture shown in FIG. 4A, using a sequence of bootstrap capacitor pre-charging phases during a startup stage allows omission of a charge pump for the top-most floating charge circuit 406 of a power converter 400 like that shown in FIG. 4A. By using selected switch configurations in a sequence of bootstrap capacitor pre-charging phases of a startup stage, the bootstrap capacitors Cn may be sufficiently pre-charged to enable normal operation of the level shifters 404 and driver circuits 402 controlling the operation of the power FETs Mn. An additional benefit is that the fly capacitors $C_{FX}$ may be partially pre-charged, thereby speeding up the overall startup process.

Figure 5A:
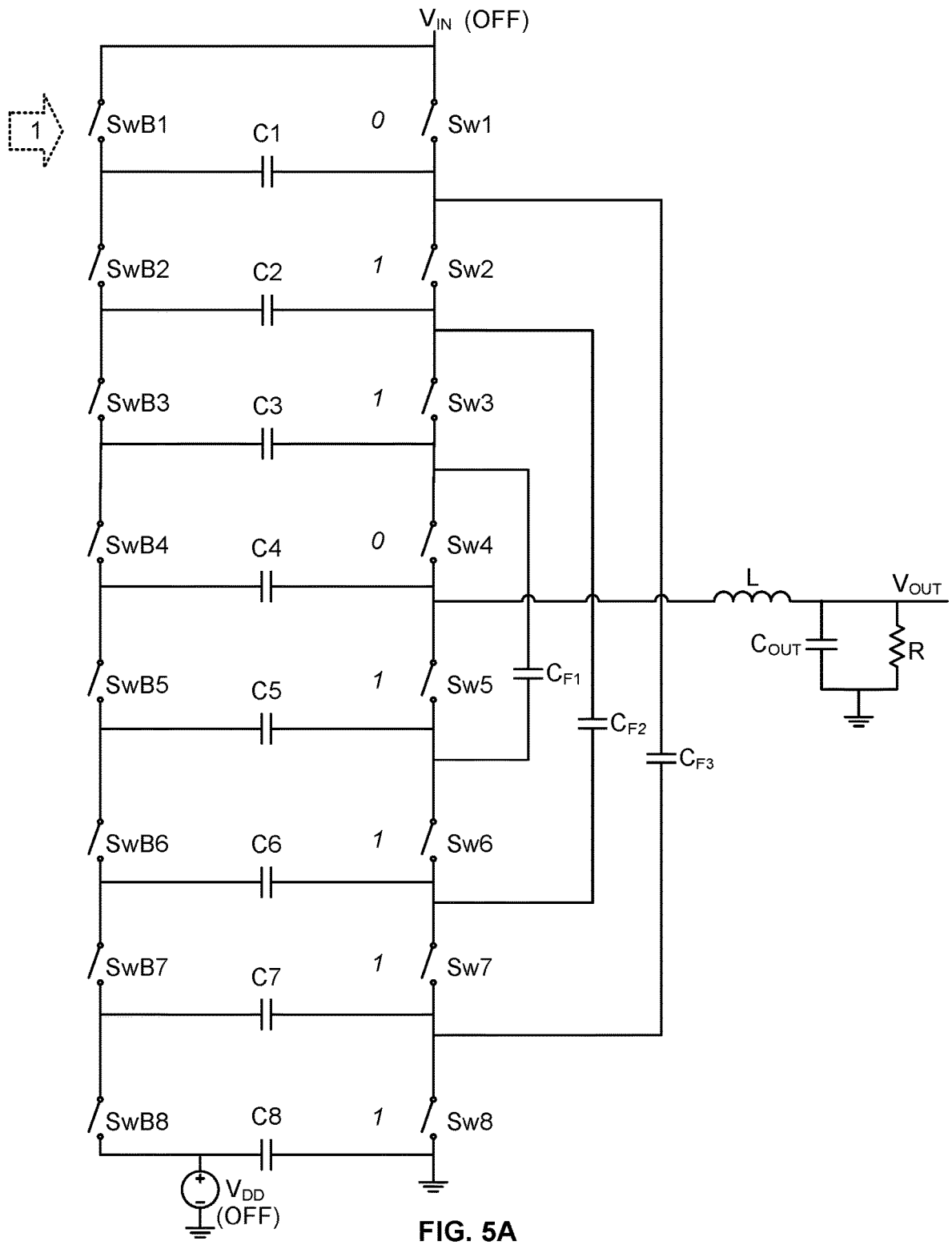
FIG. 5A is a simplified schematic diagram of a circuit like the circuit shown in FIG. 4A showing the end of a first bootstrap capacitor pre-charging phase.

FIG. 5A is a simplified schematic diagram of a circuit like the circuit shown in FIG. 4A showing the end of a first bootstrap capacitor pre-charging phase. Each of the bootstrap P-type FETs MP1 within the floating charge circuit 406 (see FIG. 4C) is represented as a bootstrap switch SwB1 to SwB8 (generically, "SwBn") coupled to a first plate of a corresponding bootstrap capacitor Cn. In addition, bootstrap switch SwB8 is coupled to a voltage source $V_{DD}$ (the remaining circuitry of each floating charge circuit 406, as well as the corresponding level-shifter circuits 404 and driver circuits 402, is omitted to reduce clutter). Each of the N-type power FETs M1-M8 (generically, "Mn") is represented as a power switch Sw1 to Sw8 (generically, "Swn"). Of course, the number of switches SwBn and Swn will vary with the number of tiers in the power converter 400.

Referring to FIG. 5A, all fly capacitors $C_{FX}$ initially are either uncharged (e.g., when the entire power converter 400 is first being powered up after a long OFF state) or are actively discharged using known techniques (e.g., when the power converter 400 is recovering from or entering into a state of operation and some charge remains on the fly capacitors $C_{FX}$). At this point, $V_{DD}=0V$ and $V_{IN}=0V$, and the first and second level shifters 410, 414 in the floating charge circuits 406 default to an output of zero volts. That zero-output value, applied to the P-type FETs MP1 (corresponding to the bootstrap switches SwBn) in the floating charge circuits 406 means that all of the bootstrap switches SwBn switches are OPEN, as shown in FIG. 5A. Similarly, the level shifters 404 corresponding to the power switches Swn also default to an output of zero volts. That zero-output value, applied to the N-type power FETs Mn, means that all of the power switches Swn switches are also OPEN, as shown in FIG. 5A.

As part of the startup sequence, the controller 422 (see FIG. 4B) is operated to output a set of startup control signals $\varphi_n$ to the power FETs Mn (i.e., the power switches Swn), as shown in FIGS. 4B and 4C. The startup control signals $\varphi_n$ are also applied, in delayed form, to the corresponding second level shifters 414 in the floating charge circuits 406 via the OUTS signal (see FIG. 4C). This startup set of control signals is generally different from the periodic clock signals normally generated after startup is completed. This startup state of operation of the controller 422 may be initiated and controlled by a command signal generated within the power converter 400 or by externally supplied commands. In the illustrated example, the controller 422 respectively sets the control signals $\varphi_1$-$\varphi_8$ for the power switches Sw1-Sw8 to the pattern "01101111", where "0" means OPEN and "1" means CLOSED. Note that this special pattern of control signals $\varphi_1$-$\varphi_8$ represents desired target switch states for the power switches Sw1-Sw8; the respective power switches Sw1-Sw8 are initially all OPEN (i.e., have a pattern of "00000000") and will only achieve the actual target states of "01101111" corresponding to the special pattern of control signals $\varphi_1$-$\varphi_8$ when the corresponding bootstrap capacitors C1-C8 are sufficiently charged to power the corresponding level shifter 404 and driver circuit 402. Accordingly, FIG. 5A shows the switches SwBn and Swn in an initial all-OPEN state rather than in their desired target states (that is, with switches Sw2, Sw3, Sw5-Sw8 CLOSED).

An added startup signal (indicated by the dotted arrow in FIG. 5A) is applied to the floating charge circuit 406 for the top bootstrap switch SwB1 (e.g., by selectively connecting the gate of the P-type FET MP1 in the floating charge circuit 406 of switch SwB1 to circuit ground during the bootstrap capacitor pre-charging phases of the startup stage) to force bootstrap switch SwB1 to be in a CLOSED state even when sufficiently powered (again noting that this is a target switch state). Thus, while control signal (pi targets power switch Sw1 to be OPEN, the added startup signal targets bootstrap switch SwB1 to be CLOSED. The added startup signal may be provided by the controller 422.

Figure 5B:
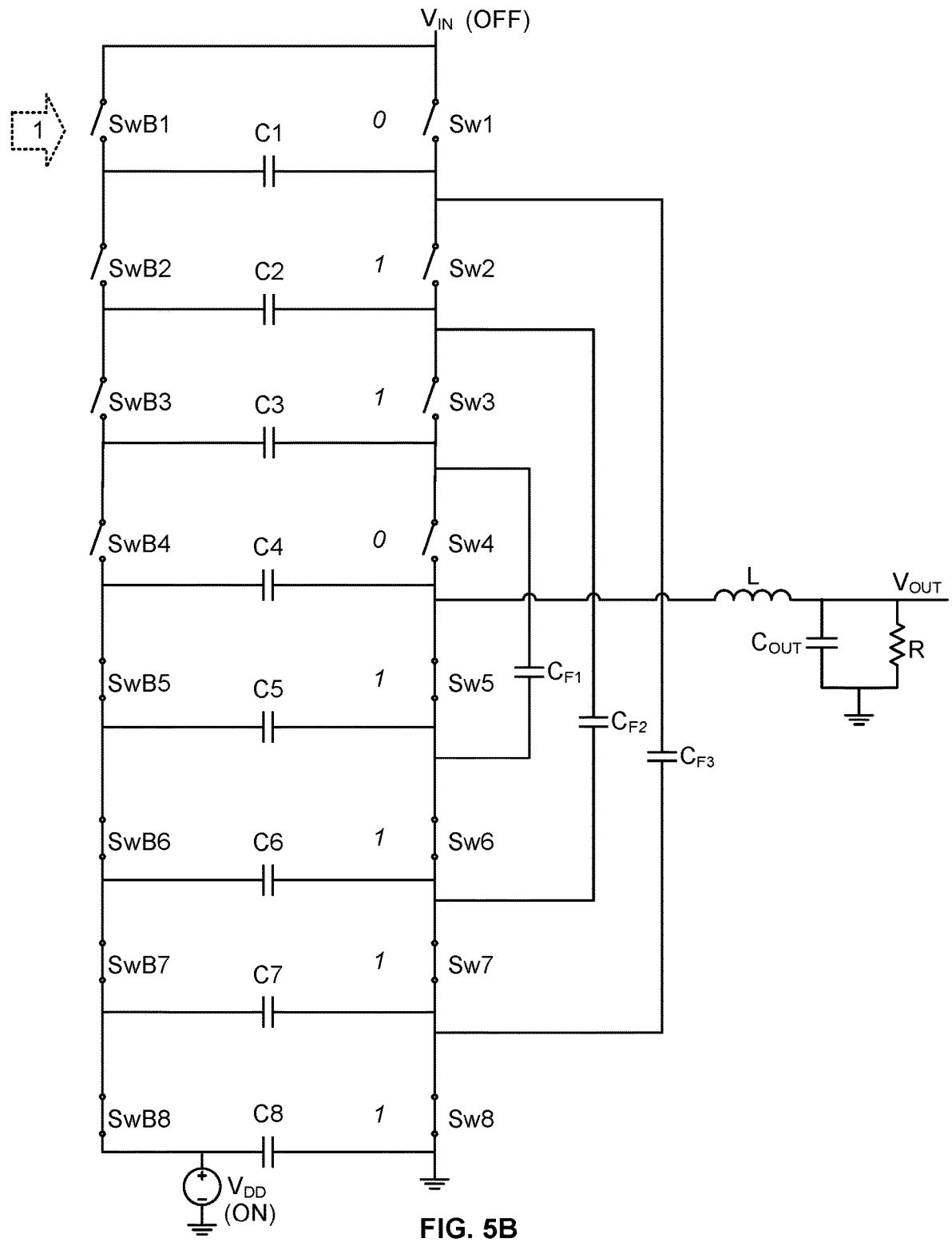
FIG. 5B is a simplified schematic diagram of the circuit of FIG. 5A showing the end of a second bootstrap capacitor pre-charging phase.

FIG. 5B is a simplified schematic diagram of the circuit of FIG. 5A showing the end of a second bootstrap capacitor pre-charging phase. When $V_{DD}$ is applied to terminal v2 of the floating charge circuit 406 for the bottom bootstrap switch SwB8, bootstrap capacitor $C_8$ is charged. Since the control signal $\varphi_8$ for power switch Sw8 has a target value of "1" (CLOSED), when the charge on bootstrap capacitor C8 has become sufficient to power the corresponding level shifter 404 and driver circuit 402, power switch Sw8 will remain CLOSED for the rest of the bootstrap capacitor pre-charging phases. In addition, the voltage differential between the gate and drain of the P-type FET MP1 in the floating charge circuit 406 for the bottom bootstrap switch SwB8 will cause FET MP1 to begin conducting, and thus bootstrap switch SwB8 will be in a CLOSED state, matching the target state for switch Sw8.

Because the P-type FET MP1 in the floating charge circuit 406 for the bottom bootstrap switch SwB8 is now CLOSED, charge will flow from $V_{DD}$ to the floating charge circuit 406 for the next upward bootstrap switch SwB7, as described above. Accordingly, bootstrap capacitor $C_7$ will be charged, power switch Sw8 will CLOSE to match its target state set by the control signal $\varphi_7$, and corresponding bootstrap switch SwB7 will transition to a CLOSED state.

In a similar fashion, charge will transfer from bootstrap capacitor $C_7$ through bootstrap switch SwB7 to bootstrap capacitor C6 (thus CLOSING power switch Sw6 to match its target state), from bootstrap capacitor C6 through bootstrap switch SwB6 to bootstrap capacitor C5 (thus CLOSING power switch Sw5 to match its target state), and from bootstrap capacitor C5 through bootstrap switch SwB5 to bootstrap capacitor C4. At this point in the startup sequence, bootstrap switches SwB5-SwB8 all match the target state ("1111") for their corresponding power switches Sw5-Sw8.

The target state set by the control signal $\varphi_4$ for power switch Sw4 is OPEN ("0"). Accordingly, while there is sufficient charge on bootstrap capacitor C4 to close bootstrap switch SwB4 and power switch Sw4, they will instead remain OPEN to match the target state (i.e., $\varphi_4$="0"). At this point, the cascade of charge from $V_{DD}$ upwards through the set of tiers ends, and power switches Sw1-Sw3 are not affected by the flow of charge from $V_{DD}$, and hence nominally remain OPEN (but see the discussion of FIG. 5C). Thus, at the end of the second bootstrap capacitor pre-charging phase, the switches Swn and SwBn are as shown in FIG. 5B.

Of note, by closing power switches Sw5-Sw8, each of the fly capacitors $C_{FX}$ (C4 to $C_8$) have one plate coupled to circuit ground.

Figure 5C:
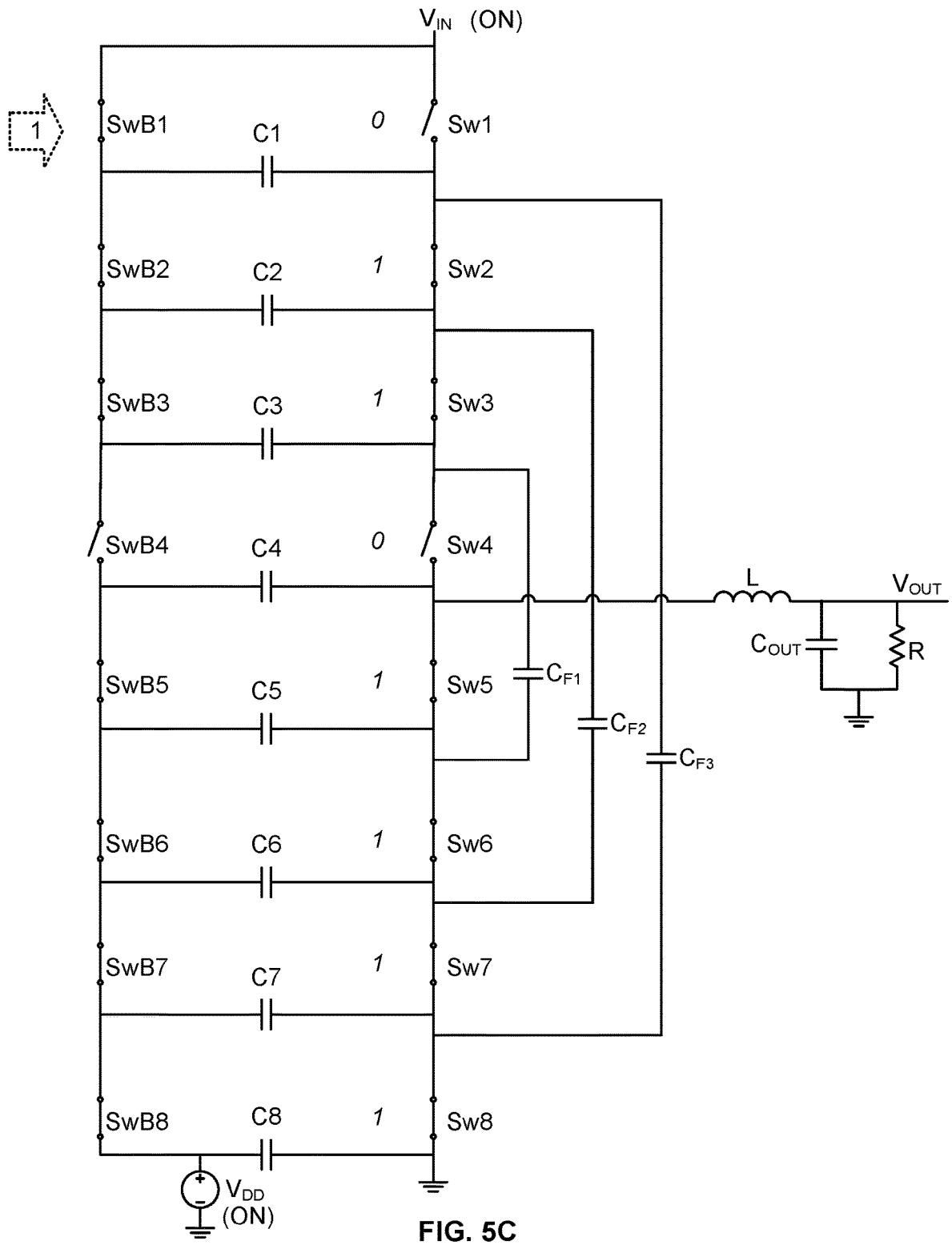
FIG. 5C is a simplified schematic diagram of the circuit of FIG. 5A showing the end of a third bootstrap capacitor pre-charging phase.

FIG. 5C is a simplified schematic diagram of the circuit of FIG. 5A showing the end of a third bootstrap capacitor pre-charging phase. As or after $V_{DD}$ is applied, as described above, $V_{IN}$ may be applied. Since $V_{IN}$ is tied to the source of the P-type FET MP1 in the floating charge circuit 406 of the topmost bootstrap switch SwB1, bootstrap switch SwB1 begins to conduct (turns ON) when $V_{IN}$ is above the threshold voltage $V_{TH}$ of the P-type FET. Accordingly, charge will flow from $V_{IN}$ to bootstrap capacitor C1. When bootstrap capacitor C1 is sufficiently charged, the corresponding level shifter 404 and driver circuit 402 for power switch Sw1 (an N-type FET) can maintain the original OPEN state of that switch, thus matching its target state (i.e., $\varphi_1$="0"). However, while bootstrap switch SwB1 would normally follow the OPEN/CLOSED state of power switch Sw1, the added startup signal (indicated by the dotted arrow in FIG. 5C) maintains bootstrap switch SwB1 in a CLOSED state, which allows charge to flow from $V_{IN}$ to bootstrap switch SwB2.

As was the case with bootstrap switch SwB1, bootstrap switch SwB2 begins to conduct (turns ON) when $V_{IN}$ is above the $V_{TH}$ of the P-type FET MP1 in the corresponding floating charge circuit 406. As a result, charge will flow from $V_{IN}$ through bootstrap switches SwB1 and SwB2 to bootstrap capacitor C2. When bootstrap capacitor C2 is sufficiently charged, the corresponding level shifter 404 and driver circuit 402 will have sufficient power to set power switch Sw2 to a CLOSED state, thus matching its target state (i.e., $\varphi_2$="1").

In a similar fashion, bootstrap switch SwB3 begins to conduct, enabling power switch Sw3 to be set to a CLOSED state, thus matching its target state (i.e., $\varphi_3$="1"). Accordingly, just before the end of the third phase of the bootstrap capacitor pre-charging phases, switches SwB1-SwB3, SwB5-SwB8, Sw2-Sw3, and Sw5-Sw8 are CLOSED, and switches Sw1, SwB4, and Sw4 are OPEN. Thus, near the end of the third bootstrap capacitor pre-charging phase, the switches Swn and SwBn are as shown in FIG. 5C and bootstrap capacitors Cn are pre-charged.

In general, after the voltages across bootstrap capacitors C1-C3 reach desired respective values, the bootstrap switches SwB1-SwB3 and the power switches Sw2-Sw3 may be opened by the controller 422 to isolate the bootstrap capacitors from $V_{IN}$. Further, when the voltage across bootstrap capacitor C3 reaches a desired value, the added startup signal may be removed by the controller 422, thus allowing the state of bootstrap switch SwB1 to follow the state of power switch Sw1.

Of note, when bootstrap switches SwB1-SwB3 are in a CLOSED state and the corresponding bootstrap capacitors C1-C3 are charged, then fly capacitors $C_{F1}$-$C_{F3}$ will also begin to charge since power switches Sw6-Sw8 are also closed and thus each of the fly capacitors $C_{FX}$ has one plate coupled to circuit ground. Because the fly capacitors $C_{F1}$-$C_{F3}$ are much larger than their corresponding bootstrap capacitors C1-C3, the voltage across the fly capacitors $C_{F1}$-$C_{F3}$ will rise much slower than the voltage across the corresponding bootstrap capacitors C1-C3. Accordingly, the fly capacitors $C_{FX}$ may still need to be more fully charged before the startup stage is fully completed. Additional circuitry (not shown) may be used to accomplish such charging. Examples of such circuitry may be found, for instance, in U.S. Pat. No. 10,720,843, entitled "Multi-Level DC-DC Converter with Lossy Voltage Balancing", issued Jul. 21, 2020, assigned to the assignee of the present invention, the contents of which are incorporated by reference.

Note that all of the SwBn and Swn switches cannot be closed or there will be a shorting path from $V_{IN}$ to GND, so the path must be interrupted somewhere. For the illustrated example, selecting the SwB4 and Sw4 switches to be OPEN is particularly useful, because doing so would not only interrupt the shorting path but also allow the fly capacitors $C_{FX}$ to initiate charging.

In summary, with this sequence of bootstrap capacitor pre-charging phases during the startup stage, the lower bootstrap capacitors (C4-C8 in this example) may be pre-charged to $V_{DD}$, which can provide the associated floating charge circuits 406 with sufficient power to operate their corresponding level-shifter circuits 404 and driver circuits 402 and drive their corresponding power FETs Swn to the target states defined by the control signals $\varphi_4$-$\varphi_8$. The upper bootstrap capacitors (C1-C3 in this example) may also be pre-charged from $V_{IN}$, as described above. Accordingly, a separate charge pump is not needed to sufficiently charge the bootstrap capacitors Cn to enable normal operation of the level shifters 404 and driver circuits 402.

In the example embodiment described above, as bootstrap switches SwB1-SwB3 become CLOSED, and with power switches Sw2 and Sw3 set to a CLOSED target state, bootstrap capacitors C1-C3 will be coupled in parallel. In an alternative embodiment, power switches Sw2 and Sw3 may be left OPEN (i.e., the control signals $\varphi_1$-$\varphi_8$ for the power switches Sw1-Sw8 would have the pattern "00001111") if the floating charge circuits 406 for power switches Sw2 and Sw3 are also controlled by a respective added startup signal to force bootstrap switches SwB2 and SwB3 to be in a CLOSED state when sufficiently powered (again noting that this is a target switch state). Thus, while control signals $\varphi_1$-$\varphi_3$ target power switches Sw1-Sw3 to be OPEN, the added startup signals target bootstrap switches SwB1-SwB3 to be CLOSED during the bootstrap capacitor pre-charging phases. Note that there may be other valid sequences, but a key characteristic of this aspect of the invention is that a start-up sequence that is different from operational switching states may be used to eliminate the need for a charge pump.

Example Control Circuitry for an M-Level Multi-Level Converter Cell

Figure 6:
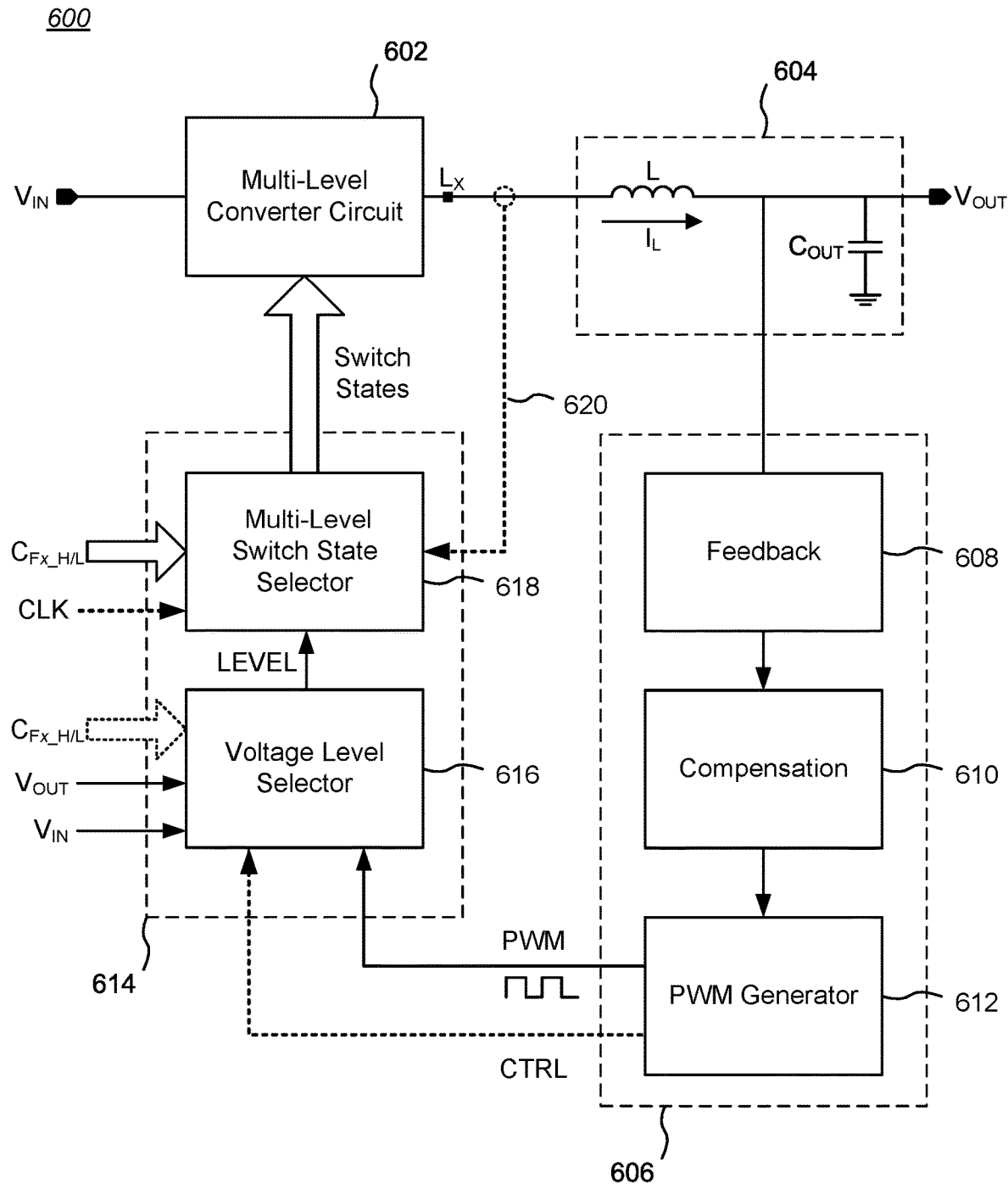
FIG. 6 is a block diagram of one embodiment of control circuitry for an M-level converter cell coupled to an output block comprising an inductor L and an output capacitor $C_{OUT}$.

FIG. 6 is a block diagram of one embodiment of control circuitry 600 for an M-level converter cell 602 coupled to an output block 604 comprising an inductor L and an output capacitor $C_{OUT}$ (conceptually, the inductor L also may be considered as being included within the M-level converter cell 602). This example control circuitry 600 is adapted from the teachings set forth in U.S. Patent Application Ser. No. 63/276,923, filed Nov. 8, 2021, entitled "Controlling Charge-Balance and Transients in a Multi-Level Power Converter", assigned to the assignee of the present invention, the contents of which are incorporated by reference. However, the present invention may be used in combination with other types of control circuitry for an M-level converter cell 602.

The control circuitry 600 functions as a control loop coupled to the output of the M-level converter cell 602 and to switch control inputs of the M-level converter cell 602. In general, the control circuitry 600 is configured to monitor the output (e.g., voltage and/or current) of the M-level converter cell 602 and dynamically generate a set of switch control inputs to the M-level converter cell 602 that attempt to stabilize the output voltage and/or current at specified values, taking into account variations of $V_{IN}$ and output load. In alternative embodiments, the control circuitry 600 may be configured to monitor the input of the M-level converter cell 602 (e.g., voltage and/or current) and/or an internal node of the M-level converter cell 602 (e.g., the voltage across one or more fly capacitors or the current through one or more power switches). Accordingly, most generally, the control circuitry 600 may be configured to monitor the voltage and/or current of a node (e.g., input terminal, internal node, or output terminal) of the M-level converter cell 602. The control circuitry 600 may be incorporated into, or separate from, the overall controller 104 for a power converter 100 embodying the M-level converter cell 602.

A first block comprises a feedback controller 606, which may be a traditional controller such as a fixed frequency voltage mode or current mode controller, a constant-on-time controller, a hysteretic controller, or any other variant. The feedback controller 606 is shown as being coupled to $V_{OUT}$ from the M-level converter cell 602. In alternative embodiments, the feedback controller 606 may be configured to monitor the input of the M-level converter cell 602 and/or an internal node of the M-level converter cell 602. The feedback controller 606 produces a signal directly or indirectly indicative of the voltage at $V_{OUT}$ that determines in general terms what needs to be done in the M-level converter cell 602 to maintain desired values for $V_{OUT}$: charge, discharge, or tri-state (i.e., open, with no current flow).

In the illustrated example, the feedback controller 606 includes a feedback circuit 608, a compensation circuit 610, and a PWM generator 612. The feedback circuit 608 may include, for example, a feedback-loop voltage detector which compares $V_{OUT}$ (or an attenuated version of $V_{OUT}$) to a reference voltage which represents a desired $V_{OUT}$ target voltage (which may be dynamic) and outputs a control signal to indicate whether $V_{OUT}$ is above or below the target voltage. The feedback-loop voltage detector may be implemented with a comparison device, such as an operational amplifier (op-amp) or transconductance amplifier (gm amplifier).

The compensation circuit 610 is configured to stabilize the closed-loop response of the feedback controller 606 by avoiding the unintentional creation of positive feedback, which may cause oscillation, and by controlling overshoot and ringing in the step response of the feedback controller 606. The compensation circuit 610 may be implemented in known manner, and may include LC and/or RC circuits.

The PWM generator 612 generates the actual PWM control signal which ultimately sets the duty cycle of the switches of the M-level converter cell 602. In some embodiments, the PWM generator 612 may pass on additional optional control signals CTRL indicating, for example, the magnitude of the difference between $V_{OUT}$ and the reference voltage (thus indicating that some levels of the M-level converter cell 602 should be bypassed to get to higher or lower levels), and the direction of that difference (e.g., $V_{OUT}$ being greater than or less than the reference voltage). In other embodiments, the optional control signals CTRL can be derived from the output of the compensation circuit 610, or from the output of the feedback circuit 608, or from a separate comparator (not shown) coupled to, for example, $V_{OUT}$. One purpose of the optional control signals CTRL is for advanced control algorithms, when it may be beneficial to know how far away $V_{OUT}$ is from a target output voltage, thus allowing faster charging of the inductor L if the $V_{OUT}$ is severely under regulated.

A second block comprises an M-level controller 614, the primary function of which is to select the switch states that generate a desired $V_{OUT}$ while maintaining a charge-balance state on the fly capacitors within the M-level converter cell 602 every time an output voltage level is selected, regardless of what switch state or states were used in the past.

The M-level controller 614 includes a Voltage Level Selector 616 which receives the PWM control signal and the additional control signals CTRL if available. In addition, the Voltage Level Selector 616 may be coupled to $V_{OUT}$ and/or $V_{IN}$, and, in some embodiments, to HIGH/LOW status signals, $C_{Fx\_H/L}$, from voltage detectors coupled to corresponding fly capacitors $C_{FX}$ within the M-level converter cell 602. A function of the Voltage Level Selector 616 is to translate the received signals to a target output voltage level (e.g., on a cycle-by-cycle basis). The Voltage Level Selector 616 typically will consider at least $V_{OUT}$ and $V_{IN}$ to determine which target level should charge or discharge the output of the M-level converter cell 602 with a desired rate.

The output of the Voltage Level Selector 616 is coupled to an M-level Switch State Selector 618, which generally would be coupled to the status signals, $C_{Fx\_H/L}$, from the capacitor voltage detectors for the fly capacitors $C_{Fx}$. Taking into account the target level generated by the Voltage Level Selector 616, the M-level Switch State Selector 618 determines which switch state for the desired output level should be best for capacitor charge-balance. The M-level Switch State Selector 618 may be implemented, for example, as a look-up table (LUT) or as comparison circuitry and combinatorial logic or more generalized processor circuitry. The output of the M-level Switch State Selector 618 is coupled to the switches of the M-level converter cell 602 (through appropriate level-shifter circuits and drivers circuits, as may be needed for a particular converter cell) and includes the switch state settings determined by the M-level Switch State Selector 618 (which selects the configuration of switches within the M-level converter cell 602 corresponding to a selected target level).

In general (but not always), the Voltage Level Selector 616 and the M-level Switch State Selector 618 only change their states when the PWM signal changes. For example, when the PWM signal goes high, the Voltage Level Selector 616 selects which level results in charging of the inductor L and the M-level Switch State Selector 618 sets which version to use of that level. Then when the PWM signal goes low, the Voltage Level Selector 616 selects which level should discharge the inductor L and the M-level Switch State Selector 618 sets which version of that level to use. Thus, the Voltage Level Selector 616 and the M-level Switch State Selector 618 generally only change states when the PWM signal changes (the PWM signal is in effect their clock signal). However, there may be situations or events where it is desirable for the CTRL signals to change the state of the Voltage Level Selector 616. Further, there may be situations or events where it is desirable for the $C_{Fx\_H/L}$ status signal(s) from voltage detectors coupled to the fly capacitors $C_{Fx}$ within the M-level converter cell 602 to cause the M-level Switch State Selector 618 to select a particular configuration of power switch settings, such as when a severe mid-cycle imbalance occurs. In some embodiments, it may be useful to include a timing function that forces the M-level Switch State Selector 618 to re-evaluate the optimal version of the state periodically, for example, in order to avoid being "stuck" at one level for a very long time, potentially causing charge imbalances.

In embodiments that utilize the teachings set forth in the patent application entitled "*Controlling Charge-Balance and Transients in a Multi-Level Power Converter*" referenced above, the M-level controller 614 implements a control method for the M-level converter cell 602 that selects an essentially optimal switch state which moves the fly capacitors $C_{Fx}$ towards a charge-balance state every time a voltage level at the $L_X$ node is selected, regardless of what switch state or states were used in the past. Accordingly, such multi-level converter circuits are free to select a different switch state or $L_X$ voltage level every switching cycle without a need to keep track of any prior switch state or sequence of switch states.

One notable benefit of the control circuitry shown in FIG. 6 is that it enables generation of voltages in boundary zones between voltage levels, which represent unattainable output voltages for conventional multi-level DC-to-DC converter circuits.

In alternative unregulated charge-pumps embodiments, the feedback controller 606 and the Voltage Level Selector 616 may be omitted, and instead a clock signal CLK may be applied to the M-level Switch State Selector 618. The M-level Switch State Selector 618 would generate a pattern of switch state settings that periodically charge balances the fly capacitors $C_{Fx}$ regardless of what switch state or states were used in the past (as opposed to cycling through a pre-defined sequency of states). This ensures that if $V_{IN}$ changes or anomalous evens occur, the system generally always seeks charge balance for the fly capacitors $C_{Fx}$.

In some embodiments, the M-level Switch State Selector 618 may take into account the current IL flowing through the inductor L by way of an optional current-measurement input 620, which may be implemented in conventional fashion.

While FIG. 6 shows a particular embodiment of control circuitry for an M-level converter cell as modified in accordance with the present invention, it should be appreciated that other control circuits may be adapted or devised to provide suitable switching signals for the switches within a converter cell.

Methods

Figure 7:
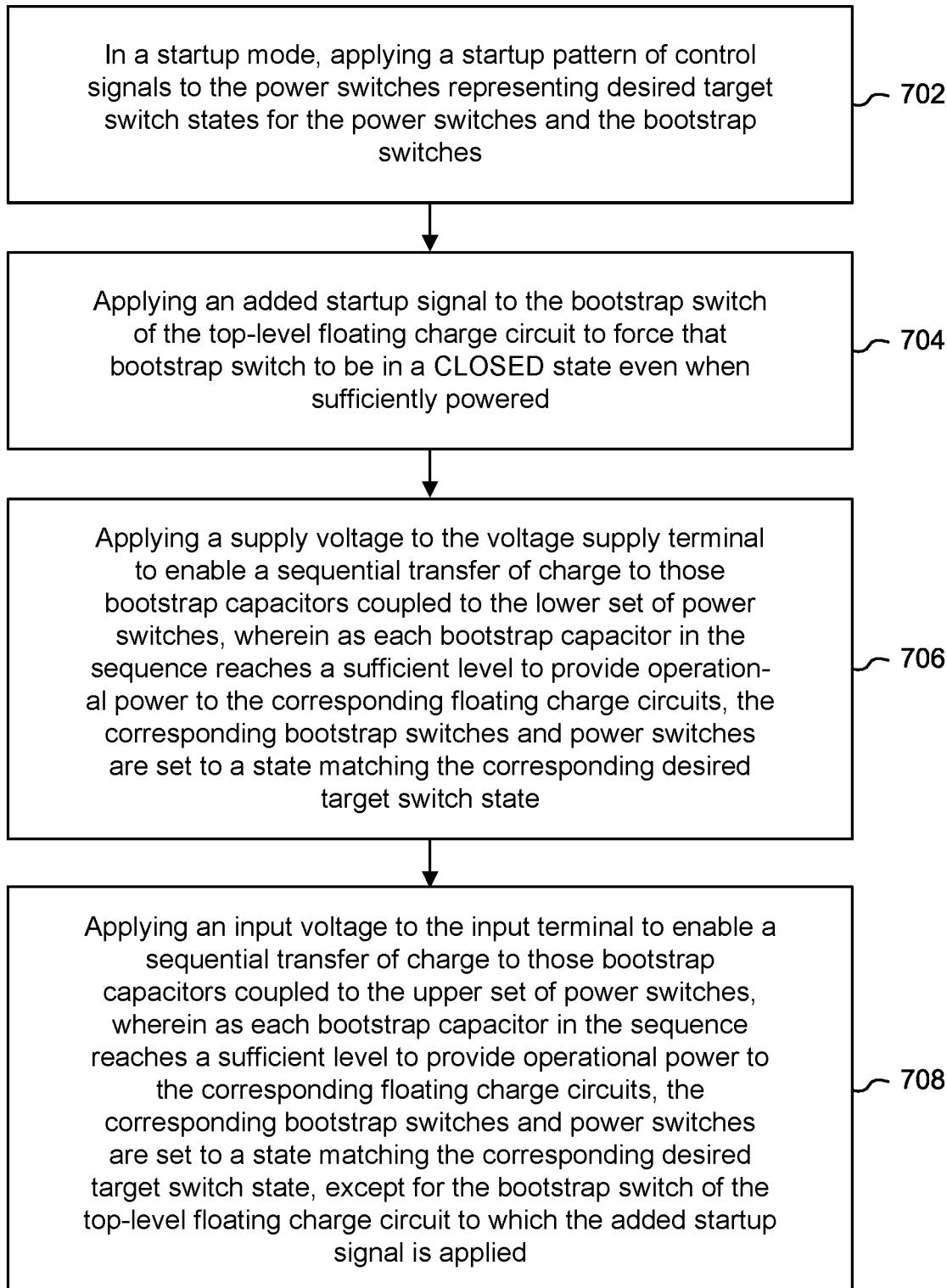
FIG. 7 is a process flow chart showing one method for providing a bootstrap power supply for LS/D circuits in a power converter without using a charge pump.

FIG. 7 is a process flow chart showing one method for providing a bootstrap power supply for LS/D circuits in a power converter without using a charge pump. Utilizing a circuit like that shown in FIG. 4A and simplified in FIGS. 5A-5C, the method includes: applying a startup pattern of control signals to the power switches representing desired target switch states for the power switches and the bootstrap switches (Block 702); applying an added startup signal to the bootstrap switch of the top-level floating charge circuit to force that bootstrap switch to be in a CLOSED state even when sufficiently powered (Block 704); applying a supply voltage to the voltage supply terminal to enable a sequential transfer of charge to those bootstrap capacitors coupled to the lower set of power switches, wherein as each bootstrap capacitor in the sequence reaches a sufficient level to provide operational power to the corresponding floating charge circuits, the corresponding bootstrap switches and power switches are set to a state matching the corresponding desired target switch state (Block 706); and applying an input voltage to the input terminal to enable a sequential transfer of charge to those bootstrap capacitors coupled to the upper set of power switches, wherein as each bootstrap capacitor in the sequence reaches a sufficient level to provide operational power to the corresponding floating charge circuits, the corresponding bootstrap switches and power switches are set to a state matching the corresponding desired target switch state, except for the bootstrap switch of the top-level floating charge circuit to which the added startup signal is applied (Block 708). Some embodiments may further include applying an added startup signal to the bootstrap switch of at last one other floating charge circuit to force that bootstrap switch to be in a CLOSED state even when sufficiently powered.

Figure 8:
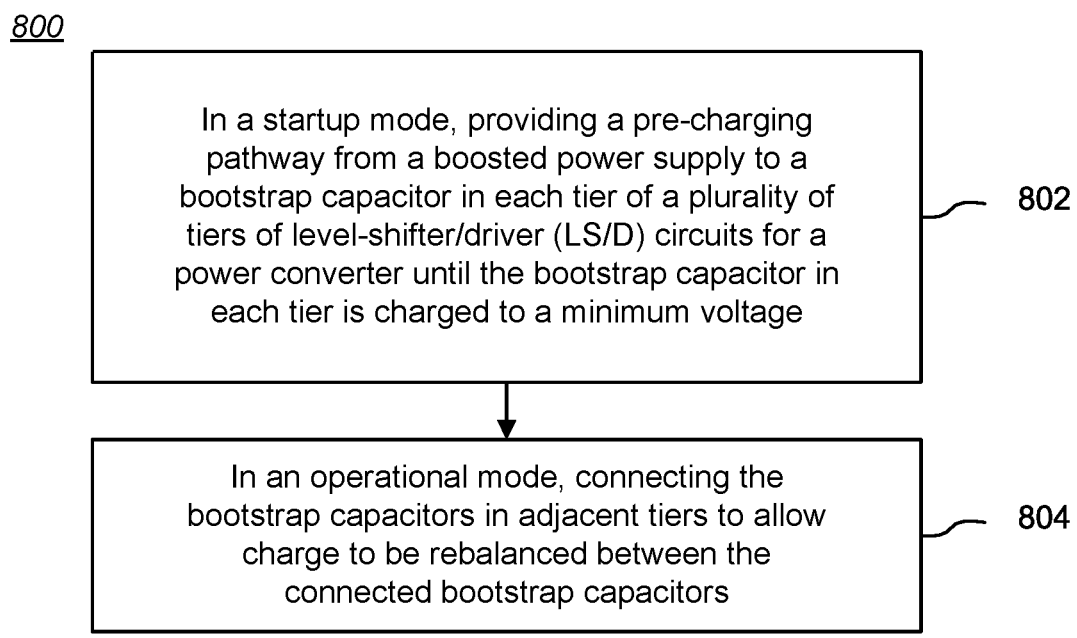
FIG. 8 is a process flow chart showing one method for providing a bootstrap power supply for LS/D circuits in a power converter.

Another aspect of the invention includes methods for providing a power-efficient bootstrap power supply for level-shifter/driver (LS/D) circuits in a power converter, such as a FET-based multi-level power converter. For example, FIG. 8 is a process flow chart 800 showing one method for providing a bootstrap power supply for LS/D circuits in a power converter. The method includes: in a startup mode, providing a pre-charging pathway from a boosted power supply (which may be current-limited) to a bootstrap capacitor in each tier of a plurality of tiers of LS/D circuits for the power converter until the bootstrap capacitor in each tier is charged to a minimum voltage (Block 802); and in an operational mode, connecting (which may be periodically) the bootstrap capacitors in adjacent tiers to allow charge to be rebalanced between the connected bootstrap capacitors (Block 804).

ADDITIONAL CONTROL AND OPERATIONAL CONSIDERATIONS

It may be desirable to provide additional control and operational circuitry (or one or more shutdown procedures) that enables reliable and efficient operation of a power converter utilizing a multi-level converter cell designed in accordance with the present disclosure. For example, in a step-down power converter, the output voltage of a converter cell is less than the input voltage of the converter cell. Shutting down or disabling (e.g., because of a fault event, such as a short) a converter cell having a designed-in inductance connected to the output while the output load current is non-zero generally requires some means for discharging the inductor current. In some embodiments, a bypass switch may be connected in parallel with a designed-in inductance connected to the output of a converter cell and controlled to be open during normal operation and closed when shutting down the converter cell or if a fault event occurs. Ideally, in order to prevent transient ringing and to provide safe discharge of the inductor current, the bypass switch can be closed before disabling converter cell switching. In alternative embodiments using MOSFETs for the main switches of the converter, the inherent body diode connected between the body and drain terminals of each MOSFET can also discharge the inductor current. Details of these solutions, as well as alternative shutdown solutions, are taught in U.S. Pat. No. 10,686,367, issued Jun. 16, 2020, entitled "Apparatus and Method for Efficient Shutdown of Adiabatic Charge Pumps", assigned to the assignee of the present invention, the contents of which are incorporated by reference.

Another consideration when combining converter cells in parallel is controlling multiple parallel power converters in order to avoid in-rush current (e.g., during a soft-start period for the power converters) and/or switch over-stress if all of the power converters are not fully operational, such as during startup or when a fault condition occurs. Conditional control may be accomplished by using node status detectors coupled to selected nodes within parallel-connected power converters to monitor voltage and/or current. Such node status detectors may be configured in some embodiments to work in parallel with an output status detector measuring the output voltage of an associated power converter during startup. The node status detectors ensure that voltages across important components (e.g., fly capacitors and/or switches) within the converter cell(s) of the power converters are within desired ranges before enabling full power steady-state operation of the parallel power converters, and otherwise prevent full power steady-state operation. The node status detectors may be coupled to a master controller that controls one or more of the parallel power converters using one or more common control signals. In furtherance of a master controller configuration, the parallel power converters may each report a power good signal (Pgood) when ready to leave a startup phase for full power steady-state operation. The master controller may essentially "AND" all such Pgood signals together, possibly along with one or more status signals from other circuits, such that the master controller does not enable full power steady-state operation of any the parallel power converter unless all of the parallel power converters are ready for that state. In essence, the Pgood signals from each parallel power converter are all tied together such that the parallel power converters may not transition out of startup phase until all the Pgood signals indicate that they are ready to transition to steady operation. Furthermore, if the Pgood signal changes due to a fault condition in one or more of the parallel power converters, the parallel power converters can transition from a steady state operation to an auto-restart or shutdown operation. Details of these solutions, as well as alternative shutdown solutions, are taught in U.S. Pat. No. 10,992,226, issued Apr. 27, 2021, entitled "Startup Detection for Parallel Power Converters", assigned to the assignee of the present invention, the contents of which are incorporated by reference.

Another consideration in operating multi-level converter cells is attaining (i.e., pre-charging) and maintaining fly capacitor voltages that are essentially fully proportionally balanced so that all switches are subjected to a similar voltage stress, since unbalanced fly capacitors can lead to breakdown of a switch (particularly FET switches) due to exposure to high voltages. One solution to both pre-charging capacitor voltages and operational balancing of capacitor voltages in a multi-level DC-to-DC converter circuit is to provide a parallel "shadow" circuit that conditionally couples a fly capacitor to a voltage source or other circuit to pre-charge that capacitor, or conditionally couples two or more fly capacitors together to transfer charge from a higher voltage capacitor to a lower voltage capacitor, or conditionally couples a fly capacitor to a voltage sink to discharge that capacitor, all under the control of real-time capacitor voltage measurements. Each parallel "shadow" circuit may comprise a switch and a resistor coupled in parallel with a main switch that is part of a multi-level converter cell (in some cases, one switch-resistor pair may span two series-connected switches). This particular solution for pre-charging and/or balancing charge on fly capacitors is very fast, provides slow pre-charging of the fly capacitors during a pre-charge period, protects switches from in-rush current, and provides stable voltages for converter cell switches. Details of this solution, as well as alternative pre-charging and charge balancing solutions, are taught in U.S. Pat. No. 10,720,843, issued Jul. 21, 2020, entitled "Multi-Level DC-DC Converter with Lossy Voltage Balancing", assigned to the assignee of the present invention, the contents of which are incorporated by reference.

Another solution to balancing capacitor voltages in a multi-level DC-to-DC converter circuit is to provide a lossless voltage balancing solution where out-of-order state transitions of a multi-level DC-to-DC converter cell are allowed to take place during normal operation. The net effect of out-of-order state transitions is to increase or decrease the voltage across specific fly capacitors, thus preventing voltage overstress on the main switches of the DC-to-DC converter. In some embodiments, restrictions are placed on the overall sequence of state transitions to reduce or avoid transition state toggling, thereby allowing each capacitor an opportunity to have its voltage steered as necessary, rather than allowing one capacitor to be voltage balanced before voltage balancing another capacitor. Details of this solution, as well as alternative charge balancing solutions, are taught in U.S. Pat. No. 10,770,974, issued Sep. 8, 2020, entitled "Multi-Level DC-DC Converter with Lossless Voltage Balancing", assigned to the assignee of the present invention, the contents of which are incorporated by reference.

An additional consideration for some embodiments is enabling operation of multi-level converter cells such that voltages can be generated in boundaries zones between voltage levels. "Boundary zones" represent unattainable output voltages for conventional multi-level DC-to-DC converter circuits. In order to generate output voltages within a boundary zone, some embodiments essentially alternate (toggle) among adjacent (or even nearby) zones by setting states of the converter cell switches in a boundary zone transition pattern. For example, a 3-level DC-to-DC converter circuit may operate in Zone 1 for a selected time and in adjacent Zone 2 for a selected time. Thus, Zones 1 and 2 are treated as a single "super-zone". More generally, in some cases, it may be useful to create super-zones using non-adjacent zones or using more than two zones (adjacent and/or non-adjacent). Details of this solution are taught in U.S. Pat. No. 10,720,842, issued Jul. 21, 2020, entitled "Multi-Level DC-DC Converter with Boundary Transition Control", assigned to the assignee of the present invention, the contents of which are incorporated by reference.

Yet another consideration for some embodiments is protection of the main power switches and other components within a power converter from stress conditions, particular from voltages that exceed the breakdown voltage of such switches (particularly FET switches). One means for protecting a multi-level power converter uses at least one high-voltage FET switch while allowing all or most other main power switches to be low-voltage FET switches.

In power converters, particularly multi-level power converters, the power switches may be implemented with FETs, especially MOSFETs. For each power FET, a driver circuit is generally required. In addition, for some power FETs, a level shifter may be required to translate ground-referenced low-voltage logic ON/OFF signals from an analog or digital controller into a signal with the same voltage swing but referenced to the source voltage of the power FET that the signal is driving in order to charge or discharge the gate of the power FET and thereby control the conducting or blocking state of the power FET. In some applications, the functions of a level shifter and a driver circuit may be incorporated into one circuit.

As should be clear, the multi-level power converter embodiments described in this disclosure may be synergistically combined with the teachings of one or more of the additional control and operational circuits and methods described in this section.

General Benefits and Advantages of Multi-Level Power Converters

Embodiments of the current invention improve the power density and/or power efficiency of incorporating circuits and circuit modules or blocks. As a person of ordinary skill in the art should understand, a system architecture is beneficially impacted utilizing embodiments of the current invention in critical ways, including lower power and/or longer battery life. The current invention therefore specifically encompasses system-level embodiments that are creatively enabled by inclusion in a large system design and application.

More particularly, multi-level power converters provide or enable numerous benefits and advantages, including:
- adaptability to applications in which input and/or output voltages may have a wide dynamic-range (e.g., varying battery input voltage levels, varying output voltages);
- efficiency improvements on the run-time of devices operating on portable electrical energy sources (batteries, generators or fuel cells using liquid or gaseous fuels, solar cells, etc.);
- efficiency improvements where efficiency is important for thermal management, particularly to protect other components (e.g., displays, nearby ICs) from excessive heat;
- enabling design optimizations for power efficiency, power density, and form-factor of the power converter—for example, smaller-size multi-level power converters may allow placing power converters in close proximity to loads, thus increasing efficiency, and/or to lower an overall bill of materials;
- the ability to take advantage of the performance of smaller, low voltage transistors;
- adaptability to applications in which power sources can vary widely, such as batteries, other power converters, generators or fuel cells using liquid or gaseous fuels, solar cells, line voltage (AC), and DC voltage sources (e.g., USB, USB-C, power-over Ethernet, etc.);
- adaptability to applications in which loads may vary widely, such as ICs in general (including microprocessors and memory ICs), electrical motors and actuators, transducers, sensors, and displays (e.g., LCDs and LEDs of all types);
- the ability to be implemented in a number of IC technologies (e.g., MOSFETs, GaN, GaAs, and bulk silicon) and packaging technologies (e.g., flip chips, ball-grid arrays, wafer level scale chip packages, wide-fan out packaging, and embedded packaging).

The advantages and benefits of multi-level power converters enable usage in a wide array of applications. For example, applications of multi-level power converters include portable and mobile computing and/or communication products and components (e.g., notebook computers, ultra-book computers, tablet devices, and cell phones), displays (e.g., LCDs, LEDs), radio-based devices and systems (e.g., cellular systems, WiFi, Bluetooth, Zigbee, Z-Wave, and GPS-based devices), wired network devices and systems, data centers (e.g., for battery-backup systems and/or power conversion for processing systems and/or electronic/optical networking systems), internet-of-things (IOT) devices (e.g., smart switches and lights, safety sensors, and security cameras), household appliances and electronics (e.g., set-top boxes, battery-operated vacuum cleaners, appliances with built-in radio transceivers such as washers, dryers, and refrigerators), AC/DC power converters, electric vehicles of all types (e.g., for drive trains, control systems, and/or infotainment systems), and other devices and systems that utilize portable electricity generating sources and/or require power conversion.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, and WiFi (e.g., 802.11a, b, g, ac, ax), as well as other radio communication standards and protocols.

Fabrication Technologies & Options

In various embodiments of multi-level power converters, it may be beneficial to use specific types of capacitors, particularly for the fly capacitors. For example, it is generally useful for such capacitors to have low equivalent series resistance (ESR), low DC bias degradation, high capacitance, and small volume. Low ESR is especially important for multi-level power converters that incorporate additional switches and fly capacitors to increase the number of voltage levels. Selection of a particular capacitor should be made after consideration of specifications for power level, efficiency, size, etc. Various types of capacitor technologies may be used, including ceramic (including multi-layer ceramic capacitors), electrolytic capacitors, film capacitors (including power film capacitors), and IC-based capacitors. Capacitor dielectrics may vary as needed for particular applications, and may include dielectrics that are paraelectric, such as silicon dioxide ($SiO_2$), hafnium dioxide ($HFO_2$), or aluminum oxide $Al_2O_3$. In addition, multi-level power converter designs may beneficially utilize intrinsic parasitic capacitances (e.g., intrinsic to the power FETs) in conjunction with or in lieu of designed capacitors to reduce circuit size and/or increase circuit performance. Selection of capacitors for multi-level power converters may also take into account such factors as capacitor component variations, reduced effective capacitance with DC bias, and ceramic capacitor temperature coefficients (minimum and maximum temperature operating limits, and capacitance variation with temperature).

Similarly, in various embodiments of multi-level power converters, it may be beneficial to use specific types of inductors. For example, it is generally useful for the inductors to have low DC equivalent resistance, high inductance, and small volume.

The controller(s) used to control startup and operation of a multi-level power converter may be implemented as a microprocessor, a microcontroller, a digital signal processor (DSP), register-transfer level (RTL) circuitry, and/or combinatorial logic.

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form an end product such as a cellular telephone, laptop computer, or electronic tablet, or to form a higher level module which may be used in a wide variety of products, such as vehicles, test equipment, medical devices, etc. Through various configurations of modules and assemblies, such ICs typically enable a mode of communication, often wireless communication.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A plurality of floating charge circuits, each including:
   (a) a power input configured to be coupled to one of a source of a boosted input voltage or a power output from a preceding adjacent floating charge circuit;
   (b) a first reference input configured to be coupled to one of source of an input voltage or to a second reference input from the preceding adjacent floating charge circuit;
   (c) a power output configured to be coupled to a first terminal of a bootstrap capacitor and to a supply terminal of a level-shifter circuit;
   (d) a second reference input configured to be coupled to a second terminal of the bootstrap capacitor, to a reference terminal of the level-shifter circuit, and to a terminal of a power switch;
   (e) a first sub-circuit configured to pre-charge the bootstrap capacitor; and
   (f) a second sub-circuit configured to transfer charge between the bootstrap capacitor and a bootstrap capacitor coupled to a subsequent adjacent floating charge circuit.

2. The plurality of floating charge circuits of claim 1, wherein the second sub-circuit periodically transfers charge between the bootstrap capacitor and the bootstrap capacitor coupled to the subsequent adjacent floating charge circuit.

3. The plurality of floating charge circuits of claim 1, wherein the first sub-circuit includes:
   (a) a series-coupled first switch and resistor coupled between the power input and the power output;
   (b) a first level shifter coupled to the first switch and configured to close the first switch while a voltage across the bootstrap capacitor is insufficient to enable operation of the power switch; and
   (c) a voltage detector coupled between the power output and the second reference input and including an output control signal coupled to the input of the first level shifter.

4. The plurality of floating charge circuits of claim 1, wherein the second sub-circuit includes:
   (a) a second switch coupled between the power input and the power output; and
   (b) a second level shifter coupled to the second switch and configured to close the second switch periodically to transfer charge between the bootstrap capacitor and the bootstrap capacitor coupled to the subsequent adjacent floating charge circuit.

5. The plurality of floating charge circuits of claim 4, wherein the second sub-circuit periodically transfers charge between the bootstrap capacitor and the bootstrap capacitor coupled to the subsequent adjacent floating charge circuit.

6. The plurality of floating charge circuits of claim 1,
    (a) wherein the first sub-circuit includes:
        (1) a series-coupled first switch and resistor coupled between the power input and the power output;
        (2) a first level shifter including an input, an output coupled to and controlling the first switch, an input voltage terminal coupled to the power input, a first reference terminal coupled to the first reference input, an output voltage terminal coupled to the power output, and a second reference terminal coupled to the second reference input; and
        (3) a voltage detector coupled between the power output and the second reference input and including an output control signal coupled to the input of the first level shifter; and
    (b) wherein the second sub-circuit includes:
        (1) a second switch coupled in series between the power input and the power output; and
        (2) a second level shifter including an input configured to be coupled to a control signal for controlling the transfer of charge, an output coupled to and controlling the second switch, an input voltage terminal coupled to the power input, a first reference terminal coupled to the first reference input, an output voltage terminal coupled to the power output, and a second reference terminal coupled to the second reference input.

7. The plurality of floating charge circuits of claim 6, wherein the second sub-circuit periodically transfers charge between the bootstrap capacitor and the bootstrap capacitor coupled to the subsequent adjacent floating charge circuit.

8. A floating charge circuit configured to be coupled to a bootstrap capacitor, including:
    (a) a power input configured to be coupled to one of a source of a boosted input voltage or a power output from a preceding adjacent floating charge circuit;
    (b) a first reference input configured to be coupled to one of an input voltage or to a second reference input from the preceding adjacent floating charge circuit;
    (c) a power output configured to be coupled to a first terminal of the bootstrap capacitor; and
    (d) a second reference input configured to be coupled to a second terminal of the bootstrap capacitor;
    wherein the floating charge circuit includes a first sub-circuit including a first switch and resistor coupled in series between a power input and a power output coupled to the bootstrap capacitor and configured to pre-charge the bootstrap capacitor when coupled;
    wherein the floating charge circuit includes a second sub-circuit configured to transfer charge between the bootstrap capacitor and a bootstrap capacitor coupled to a subsequent adjacent floating charge circuit.

9. The floating charge circuit of claim 8, wherein the second sub-circuit periodically transfers charge between the bootstrap capacitor and the bootstrap capacitor coupled to the subsequent adjacent floating charge circuit.

10. The floating charge circuit of claim 8, wherein the first sub-circuit includes:
    (a) a series-coupled first switch and resistor coupled between the power input and the power output;
    (b) a first level shifter including an input, an output coupled to and controlling the first switch, an input voltage terminal coupled to the power input, a first reference terminal coupled to the first reference input, an output voltage terminal coupled to the power output, and a second reference terminal coupled to the second reference input; and
    (c) a voltage detector coupled between the power output and the second reference input, the voltage detector including an output control signal coupled to the input of the first level shifter.

11. The floating charge circuit of claim 8, wherein the second sub-circuit includes:
    (a) a second switch coupled between the power input and the power output; and
    (b) a second level shifter including an input configured to receive a control signal for controlling the transfer of charge, an output coupled to and controlling the second switch, an input voltage terminal coupled to the power input, a first reference terminal coupled to the first reference input, an output voltage terminal coupled to the power output, and a second reference terminal coupled to the second reference input.

12. The floating charge circuit of claim 11, wherein the second sub-circuit periodically transfers charge between the bootstrap capacitor and the bootstrap capacitor coupled to the subsequent adjacent floating charge circuit.

13. The floating charge circuit of claim 8,
    (a) wherein the first sub-circuit includes:
        (1) a series-coupled first switch and resistor coupled between the power input and the power output;
        (2) a first level shifter including an input, an output coupled to and controlling the first switch, an input voltage terminal coupled to the power input, a first reference terminal coupled to the first reference input, an output voltage terminal coupled to the power output, and a second reference terminal coupled to the second reference input; and
        (3) a voltage detector coupled between the power output and the second reference input and including an output control signal coupled to the input of the first level shifter; and
    (b) wherein the second sub-circuit includes:
        (1) a second switch coupled between the power input and the power output; and
        (2) a second level shifter including an input configured to receive a control signal for controlling the transfer of charge, an output coupled to and controlling the second switch, an input voltage terminal coupled to the power input, a first reference terminal coupled to the first reference input, an output voltage terminal coupled to the power output, and a second reference terminal coupled to the second reference input.

14. The floating charge circuit of claim 13, wherein the second sub-circuit periodically transfers charge between the bootstrap capacitor and the bootstrap capacitor coupled to the subsequent adjacent floating charge circuit.

15. A method for providing a bootstrap power supply for a plurality of tiers of level-shifter/driver (LS/D) circuits for a power converter, including:
    (a) in a startup mode, providing a pre-charging pathway from a boosted power supply to a bootstrap capacitor in each tier until the bootstrap capacitor in each tier is charged to a minimum voltage; and
    (b) in an operational mode, connecting the bootstrap capacitors in adjacent tiers to allow charge to be rebalanced between the connected bootstrap capacitors.

16. The method of claim 15, further including detecting a voltage across the bootstrap capacitor in each tier and disabling the pre-charging pathway to the bootstrap capacitor in each tier after that bootstrap capacitor is charged to the minimum voltage.

17. The method of claim 15, wherein the pre-charging pathway from the boosted power supply is current limited.

18. The method of claim 15, further including, for each tier of the plurality of tiers:
   (a) providing a first sub-circuit configured to pre-charge the bootstrap capacitor; and
   (b) providing a second sub-circuit configured to transfer charge between the bootstrap capacitor and a bootstrap capacitor coupled to an adjacent tier.

19. The method of claim 18, wherein the first sub-circuit includes a first switch and resistor coupled in series between a power input and a power output coupled to the bootstrap capacitor.

20. The method of claim 18, wherein the second sub-circuit periodically transfers charge between the bootstrap capacitor and the bootstrap capacitor coupled to the adjacent tier.

\* \* \* \* \*

UNITED STATES PATENT AND TRADEMARK OFFICE
CERTIFICATE OF CORRECTION

PATENT NO. : 12,237,772 B2
APPLICATION NO. : 18/307631
DATED : February 25, 2025
INVENTOR(S) : Gary Chunshien Wu Page 1 of 1

It is certified that error appears in the above-identified patent and that said Letters Patent is hereby corrected as shown below:

In the Specification

In the CROSS-REFERENCE TO RELATED APPLICATIONS:

Column 1, Line 9, change "U.S. application Ser. No." to --U.S. Application No.--.

Column 1, Lines 13-14, change "Application Ser. No." to --Application No.--.

In the DETAILED DESCRIPTION:

Column 16, Line 28, change "signal (pi targets" to --signal $\varphi_1$ targets--.

Column 18, Line 59, change "U.S. Patent Application Ser. No." to --U.S. Patent Application No--.

Signed and Sealed this
Twenty-fifth Day of March, 2025

Coke Morgan Stewart
*Acting Director of the United States Patent and Trademark Office*